(12) United States Patent
Hayashi et al.

(10) Patent No.: US 9,060,159 B2
(45) Date of Patent: Jun. 16, 2015

(54) IMAGE PROCESSING DEVICE AND METHOD, AND IMAGING DEVICE

(71) Applicant: FUJIFILM Corporation, Tokyo (JP)

(72) Inventors: Kenkichi Hayashi, Saitama (JP); Kousuke Irie, Saitama (JP); Hidekazu Kurahashi, Saitama (JP); Seiji Tanaka, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/317,960

(22) Filed: Jun. 27, 2014

(65) Prior Publication Data

US 2014/0307122 A1   Oct. 16, 2014

Related U.S. Application Data

(63) Continuation of application No. PCT/JP2012/083838, filed on Dec. 27, 2012.

(30) Foreign Application Priority Data

Dec. 28, 2011  (JP) ................. 2011-289368

(51) Int. Cl.
*H04N 9/07* (2006.01)
*H04N 9/77* (2006.01)
*H04N 9/04* (2006.01)
*H04N 9/73* (2006.01)

(52) U.S. Cl.
CPC . *H04N 9/77* (2013.01); *H04N 9/07* (2013.01); *H04N 9/045* (2013.01); *H04N 9/735* (2013.01)

(58) Field of Classification Search
USPC ................................ 348/242, 280
See application file for complete search history.

(56) References Cited

U.S. PATENT DOCUMENTS

| | | | | |
|---|---|---|---|---|
| 4,709,259 A | * | 11/1987 | Suzuki | 348/280 |
| 5,889,554 A | | 3/1999 | Mutze | |
| 2003/0189650 A1 | * | 10/2003 | Gindele et al. | 348/223.1 |
| 2006/0012808 A1 | | 1/2006 | Mizukura et al. | |
| 2006/0203113 A1 | * | 9/2006 | Wada et al. | 348/302 |

(Continued)

FOREIGN PATENT DOCUMENTS

| | | |
|---|---|---|
| EP | 1 793 620 A1 | 6/2007 |
| EP | 2 061 231 A2 | 5/2009 |

(Continued)

OTHER PUBLICATIONS

International Search Report issued in PCT/JP2012/083838, mailed on Mar. 12, 2013.

(Continued)

*Primary Examiner* — Jason Flohre
(74) *Attorney, Agent, or Firm* — Birch, Stewart, Kolasch & Birch, LLP

(57) ABSTRACT

For a mosaic image in a repeated cycle with "I"×"J" ("I" and "J" are integers of 2 or more) pixels, a color mix ratio is stored in a memory unit by being associated with a pixel position in I×J pixels so that a color mix ratio A associated with a pixel position in I×J pixels of an object pixel for mixed color correction is read from the memory unit, and a mixed color component included in the object pixel is removed based on the color mix ratio A and a color signal of the object pixel to calculate a white balance gain based on a color signal of each of pixels in the mosaic image for which the mixed color correction is applied.

23 Claims, 12 Drawing Sheets

(56) References Cited

U.S. PATENT DOCUMENTS

| | | | |
|---|---|---|---|
| 2009/0096887 A1* | 4/2009 | Tamaoki | 348/222.1 |
| 2009/0122165 A1* | 5/2009 | Kinoshita | 348/241 |
| 2009/0128672 A1 | 5/2009 | Watanabe | |
| 2009/0200451 A1 | 8/2009 | Conners | |
| 2010/0032546 A1 | 2/2010 | Kawano et al. | |
| 2010/0134660 A1* | 6/2010 | Yamauchi | 348/247 |
| 2011/0019041 A1 | 1/2011 | Ishiwata et al. | |
| 2011/0102635 A1* | 5/2011 | Fukunaga et al. | 348/231.99 |
| 2011/0267494 A1 | 11/2011 | Ogawa | |
| 2012/0025060 A1* | 2/2012 | Iwata | 250/208.1 |
| 2012/0062763 A1* | 3/2012 | Kanemitsu et al. | 348/223.1 |
| 2012/0105688 A1* | 5/2012 | Kita | 348/242 |

FOREIGN PATENT DOCUMENTS

| | | |
|---|---|---|
| EP | 2 299 721 A1 | 3/2011 |
| JP | 2-210996 A | 8/1990 |
| JP | 8-23543 A | 1/1996 |
| JP | 10-271519 A | 10/1998 |
| JP | 2003-284084 A | 10/2003 |
| JP | 2007-53499 A | 3/2007 |
| JP | 2009-88255 A | 4/2009 |
| JP | 2010-130583 A | 6/2010 |
| JP | 2011-29379 A | 2/2011 |
| JP | 2011-234231 A | 11/2011 |
| WO | WO 2008/105370 A1 | 9/2008 |

OTHER PUBLICATIONS

Extended European Search Report issued Apr. 21, 2015 in corresponding European Application No. 12 862 595.1.
Extended European Search Report issued Aug. 4, 2014 in corresponding European Application No. 11 85 9479.5.
Extended European Search Report issued Jan. 27, 2015 in corresponding European Application No. 12 80 4973.1.
Extended European Search Report issued Oct. 28, 2014 in corresponding European Application No. 11 85 9950.5.
Keigo Hirakawa, et al. "Spatio-Spectral Color Filter Array Design for Optimal Image Recovery" IEEE Transactions on Image Processing, vol. 17, No. 10, Oct. 2008, pp. 1876-1890.

* cited by examiner

PIXELS SHARING AMPLIFIER (2x2 PIXELS)

| POSITION OF PIXELS IN BASIC ARRAY PATTERN | COLOR MIX RATIO |
|---|---|
| (1) G AT UPPER LEFT CORNER<br>(2)<br>(3)<br>⋮<br><br>(35)<br>(36) G AT LOWER RIGHT CORNER | $A_1$<br>$A_2$<br>$A_3$<br>⋮<br><br>$A_{35}$<br>$A_{36}$ | ion # IMAGE PROCESSING DEVICE AND METHOD, AND IMAGING DEVICE

CROSS-REFERENCE TO RELATED APPLICATIONS

This application is a Continuation of PCT International Application No. PCT/JP2012/083838 filed on Dec. 27, 2012, which claims priority under 35 U.S.C §119(a) to Japanese Patent Application No. 2011-289368 filed on Dec. 28, 2011. Each of the above application(s) is hereby expressly incorporated by reference, in its entirety, into the present application.

BACKGROUND OF THE INVENTION

1. Field of the Invention

The present invention relates to an image processing device and method, and an imaging device, and in particular to a technique of eliminating influence of a mixed color or the like between each of pixels of a mosaic image corresponding to a color filter array arranged on an imaging element of a single plate.

2. Description of the Related Art

Generally, in an imaging element having a mosaic color filter array, a mixed color is caused by light leaked from an adjacent pixel. In addition, in an imaging element having an element structure in which an amplifier is shared for each predetermined pixel group, a difference in an output characteristic occurs according to a position relation between the amplifier and each of the pixels.

There is a problem in which when a WB gain for white balance (WB) correction is calculated from a RGB color signal affected by a mixed color or the like, it is impossible to obtain an accurate WB gain.

A conventional technique of removing a mixed color component from a color signal including a mixed color component is described in Japanese Patent Application Laid-Open No. 2010-130583 (PTL 1).

An imaging device described in PTL 1 includes a coefficient table in which a correction coefficient related to a signal component mixed to each of pixels from peripheral pixels thereof is stored by being associated with each of positions of the pixels in a pixel array in which a plurality of pixels are arranged in a row direction and a column direction. The imaging device described in PTL 1 reads a corresponding correction coefficient from the coefficient table in accordance with a position of a correction object pixel so as to correct a signal of the correction object pixel by using signals of peripheral pixels thereof and the correction coefficient.

In addition, there is known a technique of effectively correcting a mixed color occurring in a captured image, caused by light incident on an imaging element at an angle, by using a simple method to perform white balance correction (Japanese Patent Application Laid-Open No. 2011-234231 (PTL 2)).

In an image processing device described in PTL 2, a white detection region is determined with respect to a black body radiation axis in a predetermined chromaticity coordinate space so that the image processing device estimates an ambient light source from an integral value of each of color components of pixels included in the white detection region. The image processing device described in PTL 2 has a feature of selecting a white detection region in accordance with a diaphragm value (F value) because an amount of mixed color components particularly depend on a size of a diaphragm.

Meanwhile, in a Bayer array known as a color filter array of an imaging element, responses of a Gr (green in an R row) pixel adjacent to an R(red) pixel in a side-to-side direction and a Gb (green in a B row) pixel adjacent to a B(blue) in the side-to-side direction should originally be the same, however, there is a problem to be solved, in which imbalance occurs between the "Gr" and the "Gb". In addition, there is a problem to be solved, in which color shading occurs in a peripheral portion of an imaging region. A color solid state imaging device described in Japanese Patent Application Laid-Open No. 2009-088255 (PTL 3) is configured to change a size (area) of a micro-lens for condensation provided on a color filter for each pixel by the pixel to solve the problem to be solved.

SUMMARY OF THE INVENTION

The invention described in PTL 1 is configured to provide a coefficient table in which a correction coefficient related to a signal component mixed to each of pixels from peripheral pixels thereof is stored by being associated with each of positions of the pixels on a sensor face, therefore, it is possible to use a proper correction coefficient for each of the positions of the pixels on the sensor face. Unfortunately, in the case, there is a problem in which a data amount of the correction coefficients becomes huge. In addition, PTL 1 describes a relational expression that is stored instead of a coefficient table to reduce a data amount. In the invention of PTL 1, however, there is a problem in which if change in a correction coefficient on a sensor face does not correspond to a specific relational expression, it is impossible to calculate a proper correction coefficient.

The image processing device described in PTL 2 is configured to select a white detection region in accordance with a diaphragm value because an amount of mixed color components depend on a size of a diaphragm, and calculate a color average value by averaging color signals of pixels corresponding to the white detection region for each color. In PTL 2, however, a mixed color component (influence of colors of peripheral pixels of an object pixel or the like, for example), which is not caused by a size of a diaphragm, is not considered, so that there is a problem in which accuracy of white balance correction is decreased.

In addition, since the invention described in PTL 3 changes a size (area) of a micro-lens provided on a color filter for each pixel by the pixel, it is difficult to manufacture the micro-lens. Further, the invention described in PTL 3 does not work if characteristics vary for each imaging element.

The present invention is made in light of the above-mentioned circumstances, and an object of the present invention is to provide an image processing device and method, and an imaging device, capable of easily eliminating influence of a mixed color or the like between each of pixels of a mosaic image even if it is a mosaic image composed of a complex color filter array, thereby enabling white balance correction to be favorably performed.

In order to achieve the object, an image processing device in accordance with a first aspect of the present invention includes: an image acquisition unit configured to acquire a mosaic image taken by an imaging unit including an imaging element having a pixel structure of I×J ("I" and "J" are integers of 2 or more, at least one of the integers is 3 or more) pixels in a repeated cycle; a storage unit configured to store each of color mix ratios corresponding to each of pixels in I× pixels by being associated with a pixel position in I×J pixels; a mixed color correction unit configured to eliminate mixed color components mixed from peripheral pixels included in a color signal of each of pixels in the mosaic image acquired by the image acquisition unit, the mixed color correction unit reading out a color mix ratio associated with the pixel position in I×J pixels of any object pixel for mixed color correction from the storage unit and eliminating the mixed color components included in the object pixel based on the read-out color mix ratio and a color signal of the object pixel; a calculation unit configured to calculate an average value for each color based on a color signal of each of pixels in the mosaic image, in which a mixed color is corrected by the mixed color correction unit; a white balance gain calculation unit configured to calculate a white balance gain based on the average value for each color calculated by the calculation unit; and a white balance correction unit configured to apply white balance correction to the color signal of each of pixels in the mosaic image based on the white balance gain calculated by the white balance gain calculation unit.

An object pixel for mixed color correction is affected by a mixed color or the like from a plurality of adjacent peripheral pixels, the affected degree depends on an azimuth direction (an up-and-down and side-to-side direction, for example) of the peripheral pixels, colors of the peripheral pixels, and the like. In a case of a mosaic image taken by the imaging unit including the imaging element having a pixel structure of I×J pixels in a repeated cycle, there are many combinations (repeated permutation) of colors and the like of a plurality of peripheral pixels with respect to any object pixel. Accordingly, even if object pixels have the same color, each of combinations of colors or the like of the peripheral pixels of the object pixels is different. As a result, output characteristics are different between object pixels having the same color.

According to the first aspect of the present invention, a color mix ratio corresponding to each of I×J pixels is stored in the storage unit by being associated with a pixel position in I×J pixels. In this case, it is preferable to determine a color mix ratio of pixels having the same color and being received the same light so that the same output can be obtained even if a combination of colors or the like of peripheral pixels of the pixels is different. In a case of applying mixed color correction to any object pixel for mixed color correction, it is configured to read out a color mix ratio associated with a pixel position in I×J pixels of the object pixel from the storage unit, and to eliminate a mixed color component included in the object pixel based on the read-out color mix ratio and a color signal of the object pixel. A white balance gain is calculated based on a color signal of each of pixels in a mosaic image for which the mixed color correction is applied as described above, whereby a high accurate white balance gain can be calculated. In addition, it is possible to achieve excellent white balance correction by applying white balance correction to the color signal of each of pixels in the mosaic image based on the calculated white balance gain.

An image processing device in accordance with another aspect of the present invention includes: an image acquisition unit configured to acquire a mosaic image taken by an imaging unit including an imaging element having a pixel structure of I×J ("I" and "J" are integers of 2 or more, at least one of the integers is 3 or more) pixels in a repeated cycle; a storage unit configured to store each of color mix ratios corresponding to each of pixels in I×J pixels by being associated with a pixel position in I×J pixels; a first calculation unit configured to calculate an integrated value for each pixel position in I×J pixels of a color signal of each of pixels in the mosaic image acquired by the image acquisition unit; an integrated value correction unit configured to correct the integrated value for each pixel position in I×J pixels calculated by the first calculation unit based on a color mix ratio associated with the pixel position in I×J pixels; a second calculation unit configured to calculate an average value for each color by adding the integrated value for each pixel position in I×J pixels for each color, corrected by the integrated value correction unit; a white balance gain calculation unit configured to calculate a white balance gain based on the average value for each color calculated by the second calculation unit; and a white balance correction unit configured to apply white balance correction to the color signal of each of pixels in the mosaic image based on the white balance gain calculated by the white balance gain calculation unit.

In the other aspect of the present invention, first an integrated value of a color signal of each of pixels in a mosaic image is calculated for each pixel position in I×J pixels, and the integrated value is corrected based on a color mix ratio corresponding to each integrated value. Subsequently, a corrected integrated value of the same color is added to calculate an average value for each color. A white balance gain is calculated based on the average value for each color. Accordingly, it is configured to allow the white balance gain calculated as described above to be the same as the white balance gain of the first aspect of the present invention, so that it is possible to achieve excellent white balance correction.

In an image processing method device in accordance with yet another aspect of the present invention, a mosaic image includes a pixel group of a basic array pattern composed of M×N (M≤I, N≤J) pixels having color pixels of a plurality of colors and serves as an image in which the pixel group of the basic array pattern is repeatedly arranged in a horizontal direction and a vertical direction.

In the image processing device in accordance with the yet another aspect of the present invention, a mosaic image is outputted from an imaging element having an element structure in which an amplifier is shared for each predetermined pixel group, and the predetermined pixel group has a size of K×L (K≤M, L≤N, K and L are natural numbers) pixels.

In the image processing device in accordance with the yet another aspect of the present invention, it is preferable that when a whole region of a mosaic image is divided into a plurality of divisions, the storage unit stores a color mix ratio for each division.

An image processing method in accordance with yet another aspect of the present invention includes: an image acquisition step of acquiring a mosaic image taken by an imaging unit including an imaging element having a pixel structure of I×J ("I" and "J" are integers of 2 or more, at least one of the integers is 3 or more) pixels in a repeated cycle; a step of preparing a storage unit configured to store each of color mix ratios corresponding to each of pixels in I×J pixels by being associated with a pixel position in I, J pixels; a mixed color correction unit configured to eliminate mixed color components mixed from peripheral pixels included in a color signal of each of pixels in the mosaic image acquired by the image acquisition unit, a mixed color correction step of reading out a color mix ratio associated with a pixel position in I×J pixels of any object pixel for mixed color correction from the storage unit and eliminating the mixed color components included in the object pixel based on the read-out color mix ratio and a color signal of the object pixel; a calculation step of calculating an average value for each color based on a color signal of each of pixels in the mosaic image, in which a mixed color is corrected in the mixed color correction step; a white balance gain calculation step of calculating a white balance gain based on the average value for each color calculated in the calculation step; and a white balance correction step of applying white balance correction to the color signal of each of pixels in the mosaic image based on the white balance gain calculated in the white balance gain calculation step.

An image processing method in accordance with yet another aspect of the present invention includes: an image acquisition step of acquiring a mosaic image taken by an imaging unit including an imaging element having a pixel structure of I×J ("I" and "J" are integers of 2 or more, at least one of the integers is 3 or more) pixels in a repeated cycle; a step of preparing a storage unit configured to store each of color mix ratios corresponding to each of pixels in I×J pixels by being associated with a pixel position in I×J pixels; a first calculation step of calculating an integrated value for each pixel position in I×J pixels of a color signal of each of pixels in the mosaic image acquired in the image acquisition step; an integrated value correction step of correcting the integrated value for each pixel position i I×J pixels calculated in the first calculation step based on a color mix ratio associated with a pixel position in I×J pixels; a second calculation step of calculating an average value for each color corrected in the integrated value correction step by adding the integrated value for each pixel position in I×J pixels for each color; a white balance gain calculation step of calculating a white balance gain based on the average value for each color calculated in the second calculation step; and a white balance correction step of applying white balance correction to the color signal of each of pixels in the mosaic image based on the white balance gain calculated in the white balance gain calculation step.

An imaging device in accordance with yet another aspect of the present invention includes: an imaging unit having a photographic optical system, and an imaging element on which a subject image is formed through the photographic optical system; an image acquisition unit configured to acquire a mosaic image outputted from the imaging unit; and the image processing device described above.

In the imaging device in accordance with the yet another aspect of the present invention, an imaging element has a structure in which a color filter with a predetermined color filter array is arranged on a plurality of pixels composed of photoelectric conversion elements arranged in a horizontal direction and a vertical direction, the color filter array includes a predetermined basic array pattern in which there are arranged a first filter corresponding to a first color consisting of one or more colors, and a second filter corresponding to a second color consisting of two or more colors, the second color having a contribution rate for acquiring a luminance signal, the contribution rate being lower than that of the first color, and in which the basic array pattern is repeatedly arranged in the horizontal direction and the vertical direction, and the basic array pattern serves as an array pattern corresponding to M×N (M≤I, N≤J) pixels.

In the imaging device in accordance with the yet another aspect of the present invention, it is preferable that one or more of the first filters are arranged in each of lines in the horizontal direction, the vertical direction, an oblique upper right direction, and an oblique lower right direction in the color filter array, and one or more of the second filters corresponding to each of colors of the second color are arranged in each of lines in the horizontal direction and the vertical direction in the color filter array in the basic array pattern, and a ratio of a pixel number of the first color corresponding to the first filter is larger than a ratio of a pixel number of each color of the second color corresponding to the second filter.

In the imaging element above, the color filter array is formed so that the first filter corresponding to the first color most contributing to acquisition of a luminance signal is arranged in each of lines in horizontal, vertical, oblique upper right, and oblique lower right directions in the color filter array, therefore, it is possible to improve reproducibility of synchronization processing in a high frequency region. In addition, the second filter corresponding to the second color consisting of two or more colors other than the first color is configured so that one or more of the second filters are arranged in each of lines in the horizontal and vertical directions in the color filter array in the basic array pattern, therefore, it is possible to reduce occurrence of a color moire (false color) to achieve high resolution. In the color filter array, since the predetermined basic array pattern is repeatedly arranged in the horizontal and vertical directions, it is possible to perform synchronization processing in accordance with a repeated pattern when the synchronization processing is performed at a subsequent stage. Further, a ratio of a pixel number of the first color corresponding to the first filter to a pixel number of each color of the second color corresponding to the second filter is changed so that especially a ratio of the pixel number of the first color most contributing to acquisition of a luminance signal is made larger than a ratio of a pixel number of each of colors of the second color corresponding to the second filter, therefore, it is possible to prevent aliasing as well as to achieve excellent reproducibility in a high frequency.

In the imaging device in accordance with the yet another aspect of the present invention, a basic array pattern is a square array pattern corresponding to 3×3 pixels, and it is preferable to arrange the first filter at a center and four corners thereof.

In the imaging device in accordance with the yet another aspect of the present invention, the first color is green (G), and the second colors are red (R) and blue (B), the predetermined basic array pattern that is a square array pattern corresponding to 6×6 pixels, and a filter array that preferably includes: a first array corresponding to 3×3 pixels, the first array including the G-filters arranged at a center and four corners thereof, B-filters arranged up and down across the G-filter arranged at the center, and R-filters arranged right and left across the G-filter arranged at the center; and a second array corresponding to 3×3 pixels, the second array including G-filters arranged at a center and four corners thereof, R-filters arranged up and down across the G-filter arranged at the center, and B-filters arranged right and left across the G-filter arranged at the center; the first array and the second array being alternately arranged in the horizontal direction and the vertical direction.

In the imaging device in accordance with the yet another aspect of the present invention, it is preferable that the imaging element has an element structure in which an amplifier is shared for each predetermined pixel group, and the predetermined pixel group has a size of K×L (K≤M, L≤N, K and L are natural numbers) pixels.

In the imaging device in accordance with the yet another aspect of the present invention, a pixel structure of the imaging element of I×J pixels in a repeated cycle is used in a cycle of a least common multiple of a basic array pattern of the M×N pixels and a predetermined pixel group of the K×L pixels.

According to the present invention, a color mix ratio corresponding to each of pixels of I×J pixels of a mosaic image having periodicity of I×J pixels is stored in the storage unit by being associated with a pixel position in I×J pixel, and a white balance gain is calculated based on an average value for each of colors of the mosaic image, the average value being corrected in accordance with the color mix ratio, therefore, it is possible to calculate a high accurate white balance gain to enable excellent white balance correction to be performed.

DETAILED DESCRIPTION OF EXEMPLARY EMBODIMENTS

Referring to accompanying drawings, embodiments of the image processing device and method, and the imaging device, in accordance with the present invention, will be described in detail.

[Embodiments of the Imaging Device]

Figure 1:
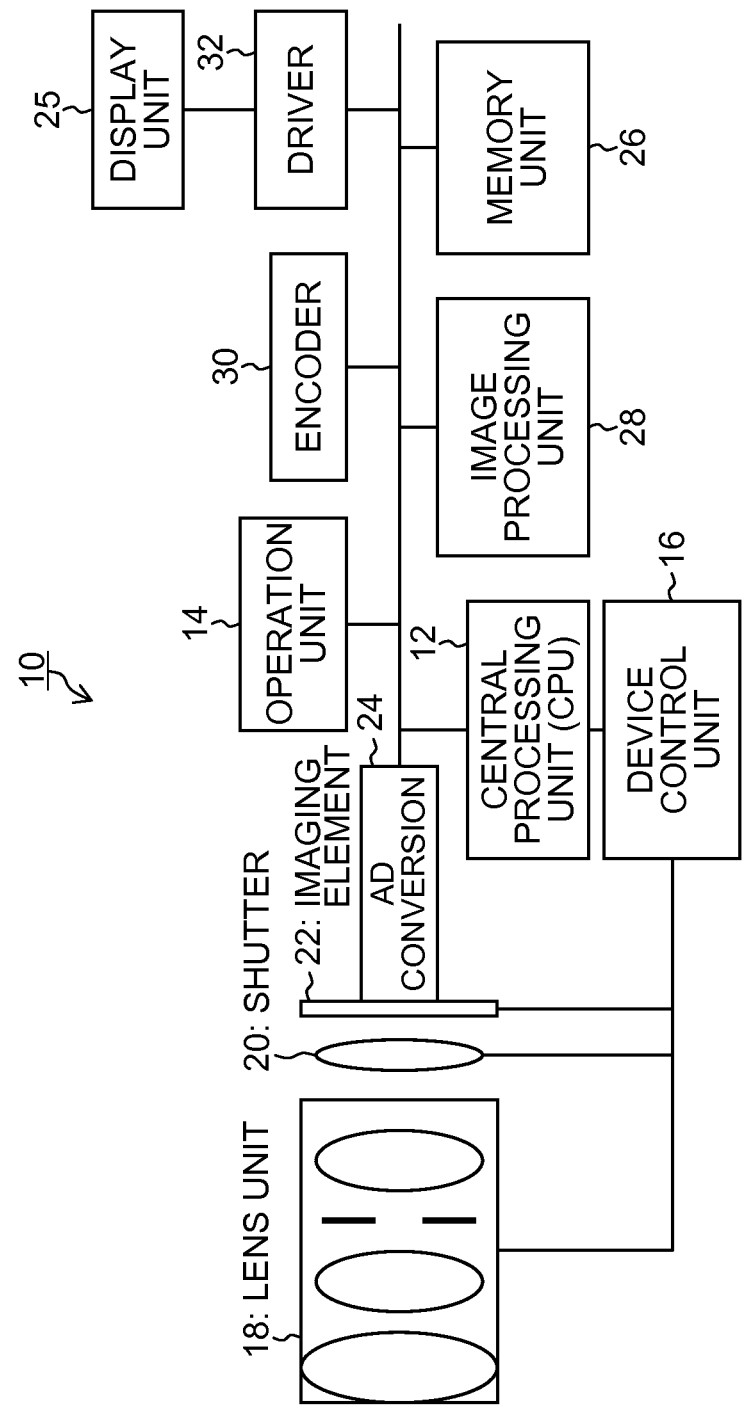
FIG. 1 is a block diagram illustrating an embodiment of an imaging device in accordance with the present invention.

FIG. 1 is a block diagram illustrating an embodiment of the imaging device in accordance with the present invention.

An imaging device 10 is a digital camera in which a photographed image is stored in an inside memory (memory unit 26) or an external storage media (not illustrated), and an operation of the whole device is centrally controlled by a central processing unit (CPU) 12.

The imaging device 10 includes an operation unit 14 provided with: a shutter button (shutter switch), a mode dial, a playback button, a MENU/OK key, a cross key, a zoom button, a BACK key, and the like. A signal from the operation unit 14 is inputted into the CPU12, and the CPU12 controls each circuit in the imaging device 10 based on the input signal, for example, controls a lens unit 18, a shutter 20, and an imaging element 22 functioning as an image acquisition unit through a device control unit 16 as well as performs photographing operation control, image processing control, image data storing and playback control, display control of a display unit 25, and the like.

The lens unit 18 includes a focus lens, a zoom lens, a diaphragm, and the like. Luminous flux passed through the lens unit 18 and the shutter 20 forms an image on a receiving surface of the imaging element 22.

The imaging element 22 is a color image sensor of a CMOS (Complementary Metal-Oxide Semiconductor) type, a XY-address type, or a CCD (Charge Coupled Device) type. On the receiving surface of the imaging element 22, a large number of light receiving elements (photodiodes) are arrayed to form a two-dimensional array. A subject image formed on the receiving surface of each of the photodiodes is converted into an amount of signal voltage (or electric charge) corresponding to an incident light amount of the subject image.

<Embodiments of the Imaging Element>

Figure 2:
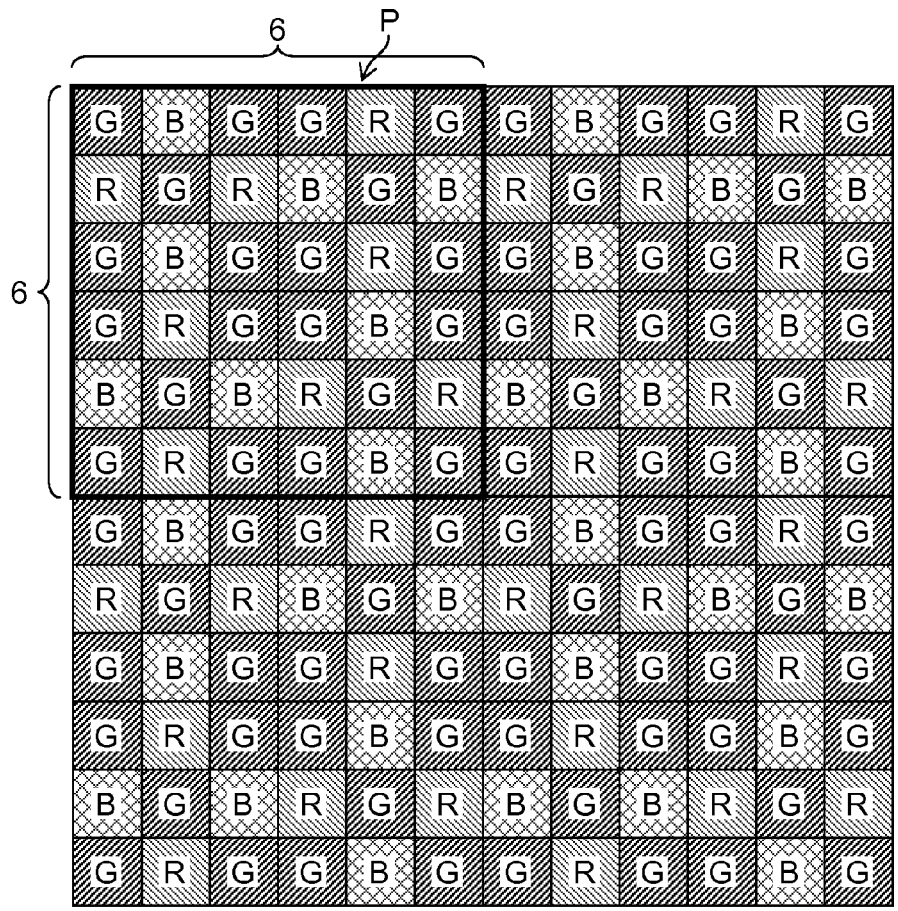
FIG. 2 illustrates a new mosaic color filter array arranged on an imaging element.

FIG. 2 illustrates an embodiment of the imaging element 22 above, especially illustrates a new color filter array arranged on the receiving surface of the imaging element 22.

The color filter array of the imaging element 22 includes a basic array pattern P (a pattern surrounded by thick lines) composed of a square array pattern corresponding to M×N (6×6) pixels. On the receiving surface of the imaging element 22, the basic array pattern P is repeatedly arranged in the horizontal and vertical directions, that is, in the color filter array, a filter (a R-filter, a G-filter, or a B-filter) of each of colors of red (R), green (G), and blue (B) is arranged in a predetermined cycle. As above, since the R-filter, the G-filter, and the B-filter are arranged in a predetermined cycle, it is possible to perform image processing or the like of RAW data (mosaic image) of RGB read out from the imaging element 22 in accordance with the repeated pattern.

In the color filter array illustrated in FIG. 2, one or more of the G-filters corresponding to a color most contributing to acquisition of a luminance signal (G color in the embodiment) are arranged in each of lines in horizontal, vertical, oblique upper right (NE), and oblique tipper left (NW) directions.

The NE represents the oblique upper right direction, and the NW represents the oblique lower right direction. In a square pixel array, for example, each of the oblique upper right direction and the oblique lower right direction is inclined 45 with respect to the horizontal direction. Meanwhile, in a rectangle pixel array, the NE and NW is a diagonal direction of the rectangle, therefore, an angle of the directions with respect to the horizontal direction may vary depending on a length of each of a long side and a short side.

The G-filter corresponding to a brightness type pixel is arranged in each of lines in horizontal, vertical, and oblique (NE and NW) directions in the color filter array, so that it is possible to improve reproducibility of synchronization processing in a high frequency region regardless of a direction to be the high frequency.

In the color filter array illustrated in FIG. 2, one or more of each of the R-filter and the B-Filter, corresponding to two or more colors other than the G color above (R and B colors in the embodiment), are arranged in each of lines in the horizontal and vertical directions in the basic array pattern.

The R-filter and B-filter are arranged in each of lines in the horizontal and vertical directions in the color filter array, so that it is possible to reduce occurrence of false color (color moire). Accordingly, an optical low-pass filter for reducing (preventing) occurrence of a false color may be eliminated. Even if an optical low-pass filter is applied, it is possible to apply a filter with a low function of removing a high frequency component to prevent occurrence of a false color, thereby enabling resolution not to be decreased.

In addition, in the basic array pattern P in the color filter array illustrated in FIG. 2, a pixel number of R-pixels, G-pixels, and B-pixels, corresponding to the R-filter, the G-filter, and the B-filter, in the basic array pattern, is 8 pixels, 20 pixels, and 8 pixels, respectively, that is, a ratio of each of the pixel numbers of RGB pixels is 2:5:2 so that a ratio of the pixel number of the G-pixels most contributing to acquisition of a luminance signal is larger than a ratio of each of the pixel numbers of the R-pixels and the B-pixels of another color.

As described above, the ratio of the pixel number of the G-pixels and the ratios of the pixel number of the R- and B-pixels are different, especially the ratio of the pixel number of the G-pixels most contributing to acquisition of a luminance signal is made larger than the ratios of the pixel numbers of the R- and B-pixels. As a result, it is possible to prevent aliasing when synchronization processing is performed as well as to achieve excellent reproducibility in a high frequency.

Figure 3:
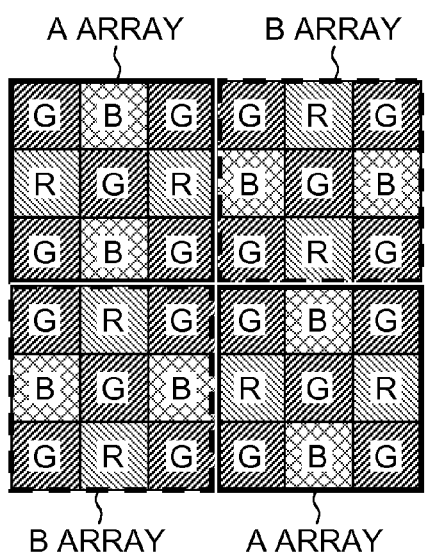
FIG. 3 illustrates a state in which a basic array pattern illustrated in FIG. 2 is divided into four divisions of 3×3 pixels.

FIG. 3 illustrates a state in which the basic array pattern P illustrated in FIG. 1 is divided into four divisions of 3×3 pixels.

As illustrated in FIG. 3, it can be perceived that the basic array pattern P is an array in which an A-array of 3×3 pixels surrounded by solid lines and a B-array of 3×3 pixels surrounded by broken lines are alternately arranged in the horizontal ad vertical directions.

Each of the A-array and the B-array is provided with G-filters that are arranged at four corners and the center thereof, and that are aligned on both diagonals. In the A-array, the R-filters are arranged in the horizontal direction across the G-filter at the center, and the B-filters are arranged in the vertical direction across the G-filter at the center. On the other hand, in the B-array, the B-filters are arranged in the horizontal direction across the G-filter at the center, and the R-filters are arranged in the vertical direction across the G-filter at the center. Thus, the A-array and the B-array have position relations between the R-filter and the B-filter, which are opposite to each other, however, have the same array other than the R-filter and the B-filter.

The G-filters at the four corners of the A-array and the B-array form a square array pattern of the G-filters corresponding to 2×2 pixels by alternately arranging the A-array and the B-array in the horizontal and vertical directions.

Signal charges accumulated in the imaging element 22 with the constitution above are read out based on a read-out signal supplied from the device control unit 16 as voltage signals corresponding to the signal charges. The voltage signals read out from the imaging element 22 are supplied to an A/D converter 24, and then are sequentially converted into R, G, and B digital signals corresponding to the color filter array to be temporarily stored in the memory unit 26.

The memory unit 26 includes an SDRAM (Synchronous Dynamic Random Access Memory) serving as a volatile memory, an EEPROM (Electrically Erasable Programmable Read-Only Memory) of a storage unit, serving as a rewritable nonvolatile memory, and the like. The SDRAM is used as a work area when the CPU12 executes a program, and as a storage area in which photographed and acquired digital image signals are temporarily stored. On the other hand, the EEPROM stores a camera control program including an image processing program, defect information on a pixel of the imaging element 22, and various parameters, tables, and the like to be used for image processing including mixed color correction, and the like.

The image processing unit 28 applies predetermined signal processing, such as mixed color correction, white balance correction, gamma correction processing, synchronization processing (demosaic processing), and RGB/YC conversion, with respect to a digital image signal temporarily stored in the memory unit 26. Here, the synchronization processing is processing in which all color information for each pixel from a mosaic image corresponding to a color filter array of a single plate type color imaging element is calculated, and the synchronization processing is also called as color interpolation processing or demosaicing processing. In a case of an imaging element composed of color filters of three colors of RGB, for example, the synchronization processing is processing of calculating color information on all RGB colors for each pixel from a mosaic image composed of RGB colors. Details of the image processing device (image processing unit 28) in accordance with the present invention will be described later.

Image data processed by the image processing unit 28 is encoded to image display data by an encoder 30, and is outputted to the display unit 25 provided on a back face of the camera through a driver 32, whereby the subject image is continuously displayed in a display screen of the display unit 25.

When the shutter button of the operation unit 14 is pressed to a first level (half press), the CPU12 controls an AF (Automatic Focus) operation and an AE (Automatic Exposure Adjustment) operation so that the operations start to move the focus lens of the lens unit 18 in an optical axis direction through the device control unit 16 to allow the focus lens to reach an in-focus position.

When the shutter button is pressed halfway, the CPU12 calculates brightness (photographing Ev value) of a subject based on image data outputted from the A/D converter 24 to determine exposure conditions (F value and shutter speed) in accordance with the photographing Ev value.

When the shutter button is pressed to a second level (all press) after the AE operation and the AF operation are finished, actual photographing is performed by controlling the diaphragm, the shutter 20, and an electric charge accumulate time in the imaging element 22 under the exposure condition determined. Image data on a mosaic image composed of RGB (an in age corresponding to the color filter array illustrated in FIG. 2), which is read out from the imaging element 22 at the time of the actual photographing and then is converted for A/D conversion by the A/D converter 24, is temporarily stored in the memory unit 26.

The image data temporarily stored in the memory unit 26 is appropriately read out by the image processing unit 28, and then the predetermined signal processing including the mixed color correction, the white balance correction, the gamma correction, the synchronization processing, the RGB/YC conversion, and the like, is applied to the image data. The image data (YC data) to which the RGB/YC conversion is applied is compressed in accordance with a predetermined compression format (a JPEG (Joint Photographic Experts Group) method, for example). The compressed image data is stored in the inside memory and the external memory in the form of a predetermined image file (an Exif (Exchangeable image file format) file, for example).

[Image Processing]

<First Embodiment>

Figure 4:
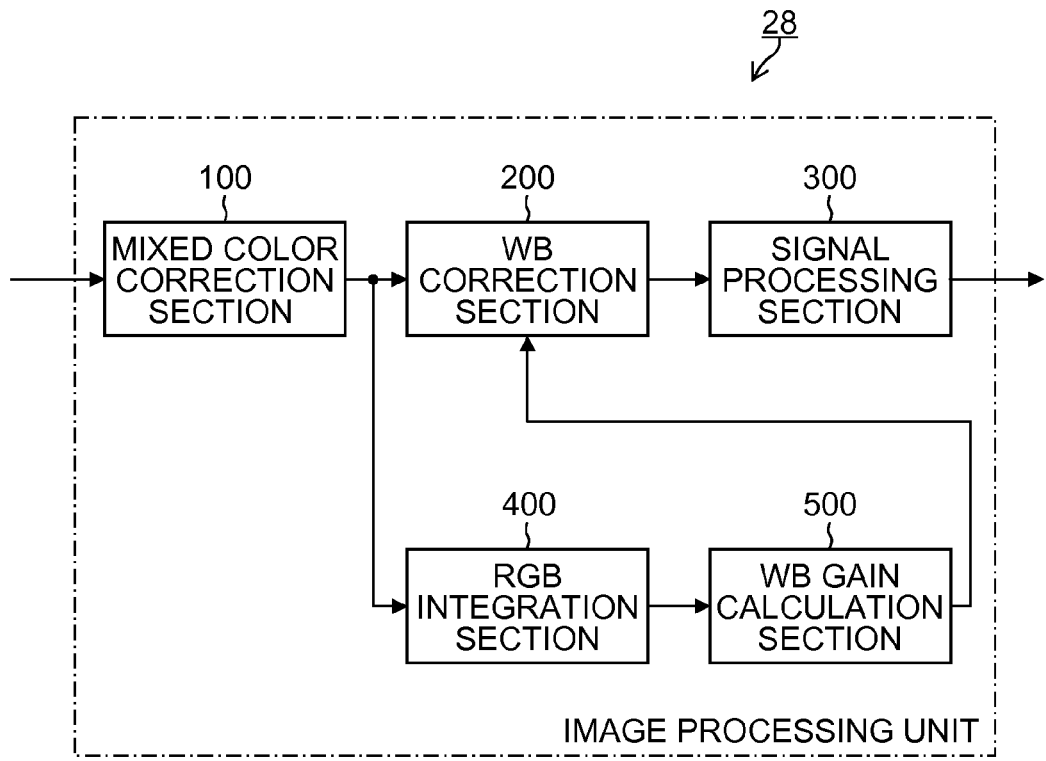
FIG. 4 is a main section block diagram illustrating an inside configuration of a first embodiment of an image processing unit illustrated in FIG. 1.

FIG. 4 is a main section block diagram illustrating an inside configuration of a first embodiment of the image processing unit 28 illustrated in FIG. 1.

As illustrated in FIG. 4, the image processing unit 28 includes: a mixed color correction section (mixed color correction unit) 100; a white balance (WB) correction section (white balance correction unit) 200; a signal processing section 300 for performing signal processing, such as the gamma correction, the synchronization processing, the RGB/YC conversion; an RGB integration section (calculation unit) 400; and a white balance (WB) gain calculation section (white balance gain calculation unit) 500.

As described above, RAW data (mosaic image) in accordance with the color filter array outputted from the imaging element 22 at the time of photographing is temporarily stored in the memory unit 26. The image processing unit 28 acquires the mosaic image (RGB color signals) from the memory unit 26.

The acquired RGB color signals are supplied to the mixed color correction section 100 in a point sequence. The mixed color correction section 100 eliminates influence of a mixed color or the like from peripheral pixels included in color signals of an object pixel for mixed color correction received in a point sequence. Details of the mixed color correction section 100 will be described later.

A color signal of each of pixels in the mosaic image, in which influence of a mixed color or the like is eliminated by the mixed color correction section 100, is supplied to a WB correction section 200 as well as to an RGB integration section 400.

The RGB integration section 400 integrates each of RGB color signals for each of divisions of 8×8 (refer to FIG. 8) into which one screen is divided, and calculates an integration average value of the color signals. The integration average value of each of RGB calculated for each of divisions by the RGB integration section 400 is supplied to the WB gain calculation section 500.

The WB gain calculation section 500 calculates color information composed of ratios (R/G and B/G) of the integration average value of RGB for each of divisions. In a case where one screen is divided into 64 divisions of 8×8, 64 pieces of color information (R/G and B/G) are calculated (calculation step).

The WB gain calculation section 500 calculates WB gains based on the color information (R/G and B/G) for each of the divisions. In particular, a barycenter of distribution of 64 pieces of color information for each of the divisions in a color space of R/G and B/G coordinate axes is calculated, and a color temperature of ambient light is estimated from color information indicated by the barycenter. In addition, instead of the color temperature, it is acceptable to seek a light source type having the color information indicated by the barycenter, such as blue sky, shade, sunshine, fluorescent light (daylight color, day white color, white color, and warm white color), tungsten, and low tungsten, to estimate a light source type at the time of photographing (refer to Japanese Patent Application Laid-Open No. 2007-053499). Further, a color temperature may be estimated from the estimated light source type.

In the WB gain calculation section 500, a WB gain for each RGB or for each RB is prepared in advance to perform proper white balance correction in accordance with a color temperature of ambient light or a light source type. The WB gain calculation section 500 reads out corresponding WB gains for each RGB or for each RB based on the estimated color temperature of the ambient light or type of light source, and outputs the read-out WB gains to the WB correction section 200 (white balance gain calculation step).

The WB correction section 200 performs white balance correction by multiplying each of color signals of R, G, and B received from the mixed color correction section 100 by a WB gain for each color, received from the WB gain calculation section 500 (white balance correction step).

The color signals of R, G, and B outputted from the WB correction section 200 is supplied to the signal processing section 300, and then the signal processing is performed, such as the gamma correction, the synchronization processing for converting the color signals of R, G, and B into a synchronous system by interpolating spatial deviation of the color signals of R, G, and B in accordance with the color filter array of the imaging element 22, the RGB/YC conversion for converting the synchronized color signals of R, G, and B into a luminance signal Y, and color difference signals Cr and Cb. The signal processing section 300 outputs the luminance signal Y, and the color difference signals Cr and Cb, to which the signal processing is applied.

Luminance data Y, and color difference data Cr and Cb outputted form the image processing unit 28 are compressed, and then stored in the inside memory and the external memory.

<Mixed Color Correction>

Figure 5:
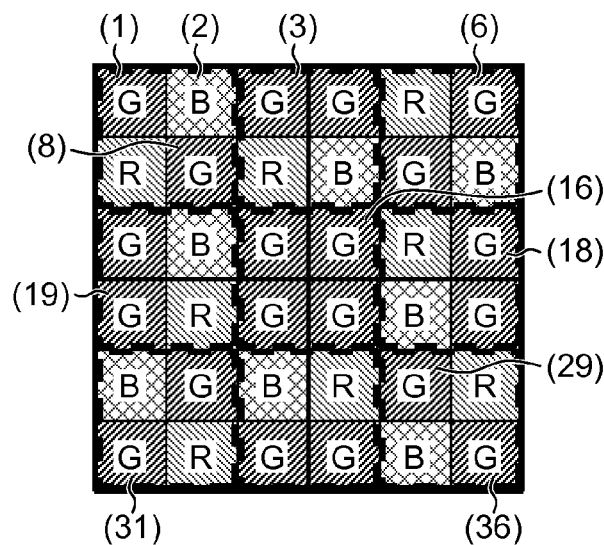
FIG. 5 illustrates a position of each of 36 pixels in the basic array pattern.

FIG. 5 illustrates a basic array pattern corresponding to 6×6 pixels illustrated in FIG. 2, the basic array pattern corresponding to a group of 36 pixels.

As illustrated in FIG. 5, a position of each of 36 pixels in the basic array pattern is indicated as from (1) to (36). A position of a G-pixel at an upper left corner in the basic array pattern is indicated as (1), and a G-pixel at a lower right corner in the basic array pattern is indicated as (36).

Eighteen pixels at the positions (1) to (18) in the basic array pattern correspond to pixels in the A-array and the B-array illustrated in FIG. 3, and eighteen pixels at the positions (19) to (36) correspond to the B-array and the A-array illustrated in FIG. 3.

Here, if the G-pixel at the position (16) is an object pixel for mixed color correction, colors of peripheral pixels (an upper pixel, a lower pixel, a left pixel, and a right pixel) adjacent to the object pixel up and down, and right and left, are B, G, G, and R, respectively. No matter which of 9 pixels of the A-array of 3×3 pixels and 9 pixels of the B-array (18 pixels of the positions (1) to (18)) is set as an object pixel, a combination of colors of 4 pixels adjacent to the object pixel up and down, and right and left, becomes different.

Influence of a mixed color from the peripheral pixels with respect to the object pixel varies depending on an azimuth direction (up and down, and right and left) of the peripheral pixels, and colors (RGB) of the peripheral pixels.

Since each of colors of 4 peripheral pixels of the object pixel can be any one of three colors of RGB, there are 81 ($3^4$=81) combinations (repeated permutation) of the colors of the 4 peripheral pixels. In the color filter array of the embodiment, there are 18 combinations of 4 peripheral pixels corresponding to 18 pixels of the A-array and the B-array.

If a pixel size of a basic array pattern is increased to allow degrees of freedom of an array of pixels of three colors of RGB to increase, the number of combinations of color arrangement of adjacent peripheral pixels is increased. In addition, if there is a pixel of emerald, or yellow other than the three colors of RGB, combinations of color arrangement increase more.

Figures 6, 7:
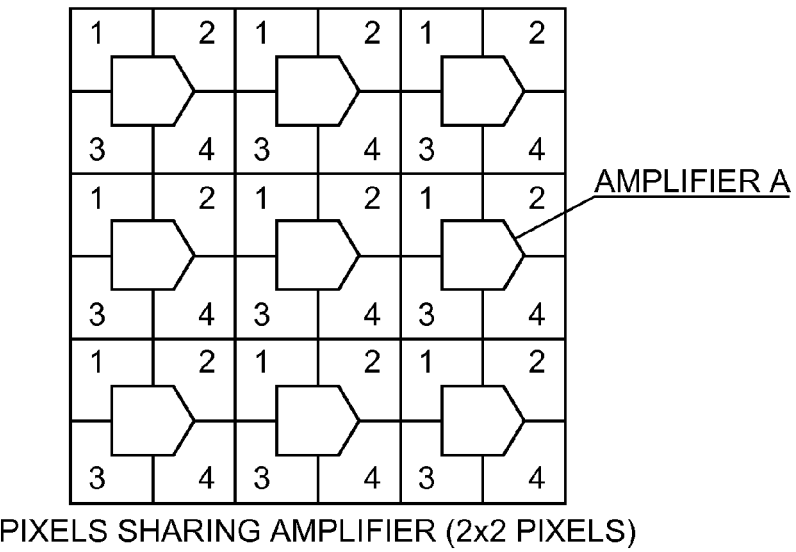
FIG. 6 illustrates an example of an imaging element in which 4 pixels of 2×2 share one amplifier.
FIG. 7 is a chart illustrating an example of a correction table that illustrates color mix ratios.

Meanwhile, the imaging element 22 of the embodiment is an imaging element of a CMOS type. An amplifier A shared by pixels is embedded in an undercoat of the CMOS, and K×L (2×2) pixels share one amplifier A, as illustrated in FIG. 6. The element structure of the imaging element 22 causes a difference in an output level of a pixel depending on the positions 1 to 4 (upper left, upper right, lower left, and lower right, positions with respect to the amplifier A) with respect to the amplifier A.

In FIG. 5, 2×2 pixels surrounded by dotted lines illustrates four pixels that share one amplifier A.

In FIG. 5, each of a G-pixel at the position (8) and a G-pixel at the position (29) is the G-pixel at the center of the A-array (refer to FIG. 3) of 3×3 pixels. Colors of peripheral pixels of the up and down, and the right and left of each of the G-pixels are B, B, R, and R, respectively, so that the pixels of the up and down, and those of the right and left, make combinations of the same color, but positions of the pixels with respect to the amplifier A are different, that is, positions of the G-pixel at the position (8) and the G-pixel at the position (29) with respect to the amplifier A correspond to 4 and 1, respectively, as illustrated in FIG. 6.

Thus, the G-pixel at the position (8) and the G-pixel at the position (29) produce different output levels even if combinations of colors of peripheral pixels thereof are the same.

In a case where a basic array pattern is M×N pixels (M×N pixels in a case where color arrangement in M×N pixels is asymmetry), a combination of colors of peripheral pixels of each of all pixels of M×N pieces becomes different. In addition, in a case where a pixel group sharing an amplifier is composed of K×L (K≤M, L≤N) pixels, each of K×L pixels has a different position with respect to the amplifier, thereby causing a different output level.

Accordingly, there are combinations of a position of each of M×N pixels in the basic array pattern and a position of each of K×L pixels of the pixel group sharing the amplifier, the number of the combinations being the same as the number of the least common multiple of M×N pixels and K×L pixels.

In the basic array pattern of 6×6 pixels of the embodiment illustrated in FIG. 3, color arrangement in 6×6 pixels is symmetric (the A-array and the B-array are alternately arranged). Accordingly, a minimum pixel size of an array pattern in which a combination of colors of 4 peripheral pixels is different is 3×6 pixels.

On the other hand, in the pixel group sharing one amplifier A of the embodiment illustrated in FIG. 6 has 2×2 pixels. The least common multiple of 3×6 pixels and 2×2 pixels is 36 (=6×6).

Thus, no matter which of 36 pixels in the basic array pattern illustrated in FIG. 5 is set as an object pixel, at least one of a combination of colors of 4 peripheral pixels of the object pixel and a position of the object pixel in the pixel group sharing the amplifier A is different.

FIG. 7 illustrates a correction table illustrating color mix ratios to be stored in the memory unit 26. In the correction table, 36 color mix ratios (correction coefficients) A1 to A36 corresponding to the positions (1) to (36) of pixels in the basic array pattern are stored.

The color mix ratios $A_1$ to $A_{36}$ are determined to be a coefficient for correcting an output level of a pixel so that when uniform white color light (daylight D50, for example), for example, enters each of pixels of the imaging element 22, output levels of pixels (in the case of the embodiment, 8 R-pixels, 20 G-pixels, and 8 B-pixels) of the same color are to be equal, preferably, output levels of all 36 pixels are to be equal.

When the correction table is stored in the memory unit 26, it is preferable to determine the color mix ratios $A_1$ to $A_{36}$ above in advance at the time of an inspection before shipping products and store the color mix ratios for each of products (preparation step).

Figure 8:
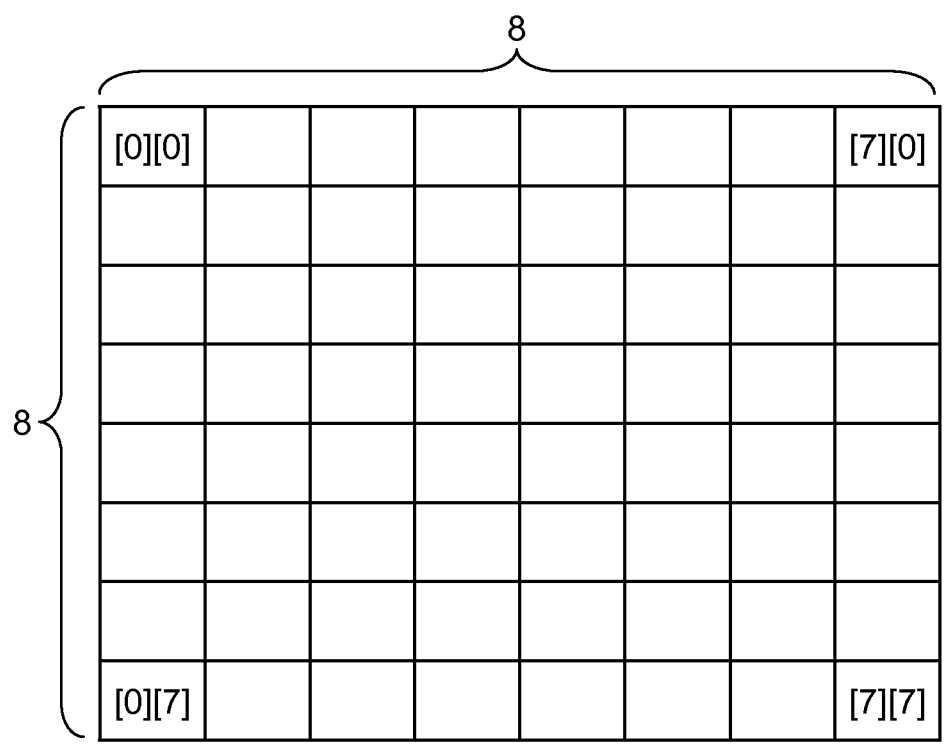
FIG. 8 illustrates divisions of 8×8 in a mosaic image.

An incident angle of subject light with respect to each of pixels of the imaging element 22 at a central portion and at a peripheral portion of the mosaic image are different, so that a color mix ratio of each of the portions is different. Thus, it is configured to divide a whole region of the mosaic image into 8×8 divisions, for example, as illustrated in FIG. 8, and store the correction table illustrated in FIG. 7 in the memory unit 26 for each of the divisions.

Figure 9:
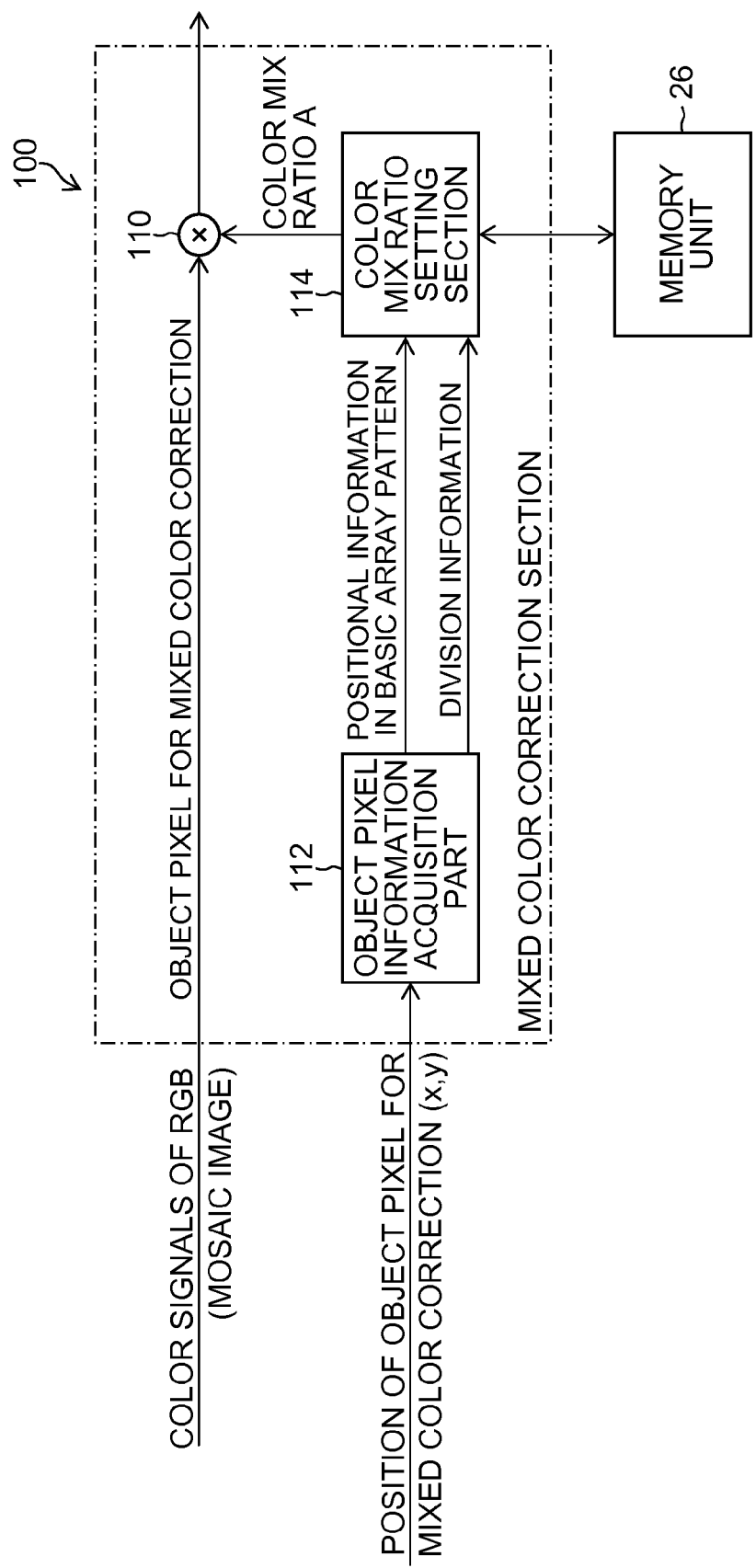
FIG. 9 is a block diagram illustrating an embodiment of an inside configuration of mixed color correction section illustrated in FIG. 4.

FIG. 9 is a block diagram illustrating an embodiment of an inside configuration of the mixed color correction section 100 illustrated in FIG. 4.

The mixed color correction section 100 includes a multiplier 110, an object pixel information acquisition part 112, and a color mix ratio setting part 114.

In FIG. 9, a mosaic image (color signals of RGB) acquired through the imaging element 22 is supplied to the multiplier 110 in a point sequence.

Meanwhile, information illustrating a position (x,y) of an object pixel for mixed color correction in the mosaic image, the object pixel being supplied to the multiplier 110, is supplied to the object pixel information acquisition part 112. The object pixel information acquisition part 112 acquires positional information illustrating a position of the object pixel in the basic array pattern (a position of any one of the positions (1) to (36) illustrated in FIG. 5) and division information illustrating divisions to which the object pixel belongs (refer to FIG. 8) based on the information illustrating the position (x,y) of the object pixel. The positional information on the object pixel in the basic array pattern and the division information acquired by the object pixel information acquisition part 112 are outputted to the color mix ratio setting part 114.

The color mix ratio setting part 114 reads out a corresponding color mix ratio A from the memory unit 26 based on the positional information in the basic array pattern and the division information received from the object pixel information acquisition part 112, and inputs the color mix ratio A to the multiplier 110 together with another input, that is, the color mix ratio setting part 114 selects a correction table corresponding to the divisions to which the object pixel belongs, based on the division information, and reads out a color mix ratio A (a color mix ratio of any one of color mix ratios $A_1$ to $A_{36}$) stored by being associated with the positions (1) to (36) in the basic array pattern as illustrated FIG. 7 from the selected correction table based on the positional information in the basic array pattern.

The multiplier 110 multiplies the received color signal of the object pixel for mixed color correction and the received color mix ratio A together, and outputs the multiplication value as a color signal in which influence of a mixed color or the like is eliminated to the WB correction section 200 and the RGB integration section 400 illustrated in FIG. 4 described before.

<Image Processing Method>

Figure 10:
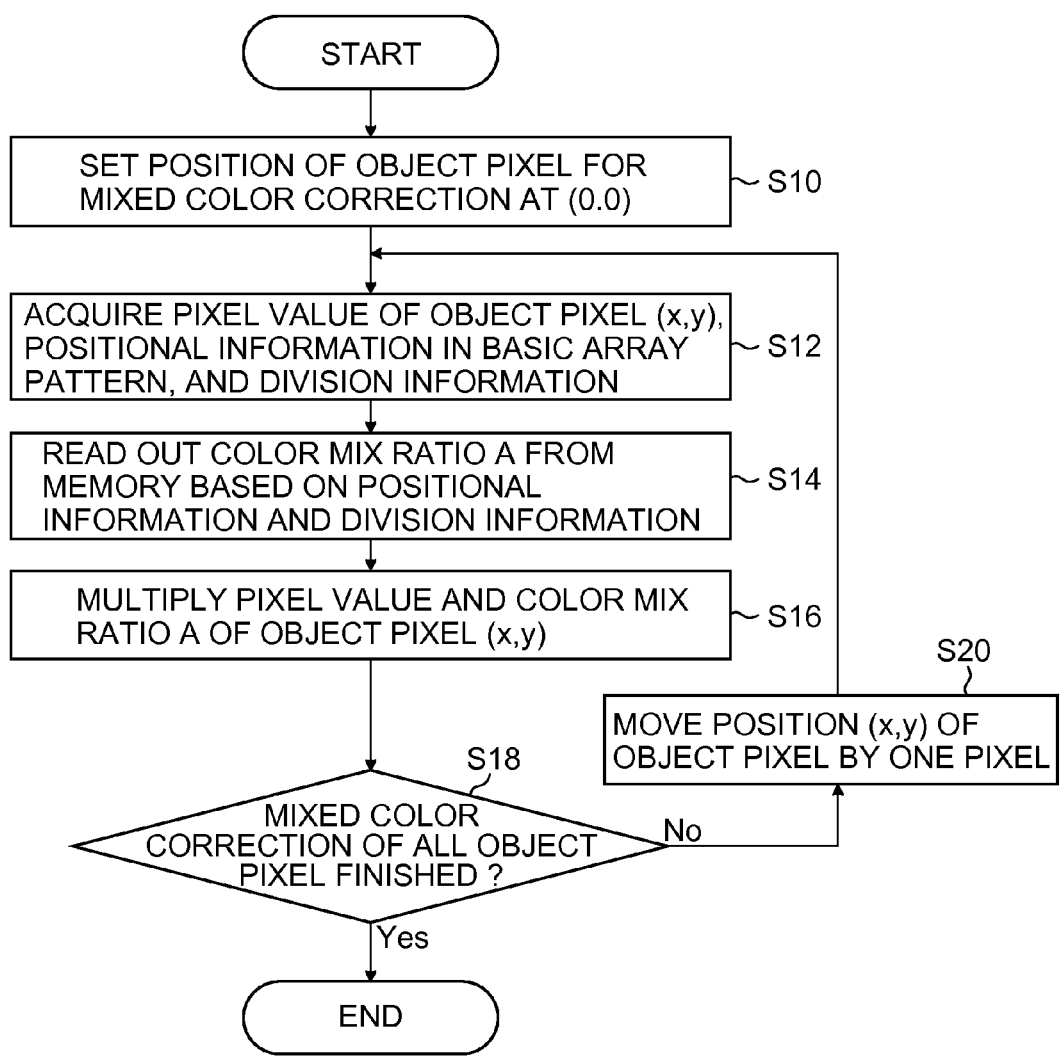
FIG. 10 is a flow chart illustrating an embodiment of an image processing method in accordance with the present invention.

FIG. 10 is a flow chart illustrating an embodiment of the image processing method in accordance with the present invention.

In FIG. 10, the mixed color correction section 100 first sets a position (x,y) of the object pixel for mixed color correction before starting mixed color correction as an initial value (0,0) (step S10).

Subsequently, a color signal (pixel value) of the object pixel (x,y), positional information on the object pixel (x,y) in the basic array pattern, and division information, are to be acquired (step S12, image acquisition step).

The color mix ratio setting part 114 reads out a corresponding color mix ratio A from the memory unit 26 based on the acquired positional information and division information (step S14).

Next, the pixel value of the object pixel (x,y) acquired in the step S12 and the color mix ratio A read out in the step S14 are multiplied together, and the multiplication value is acquired as a pixel value in which influence of a mixed color or the like is eliminated (step S16, mixed color correction step).

Subsequently, it is determined whether mixed color correction of all object pixels is finished (step S18), if not finished (in a case of "No"), the processing is transferred to step S20.

In the step S20, it is configured to move the position (x,y) of the object pixel by one pixel, and to return the position (x,y) of the object pixel in the horizontal direction to the right end when the position (x,y) of the object pixel in the horizontal direction reaches the left end, as well as move the position (x,y) of the object pixel by one pixel in the vertical direction to transfer the processing to the step S12. The processing from the step S12 to the step S18 described above is repeatedly executed.

Meanwhile, in the step S18, if it is determined that mixed color correction of all object pixels is finished (in a case of "Yes"), the mixed color correction is finished.

<Second Embodiment>

Figure 11:
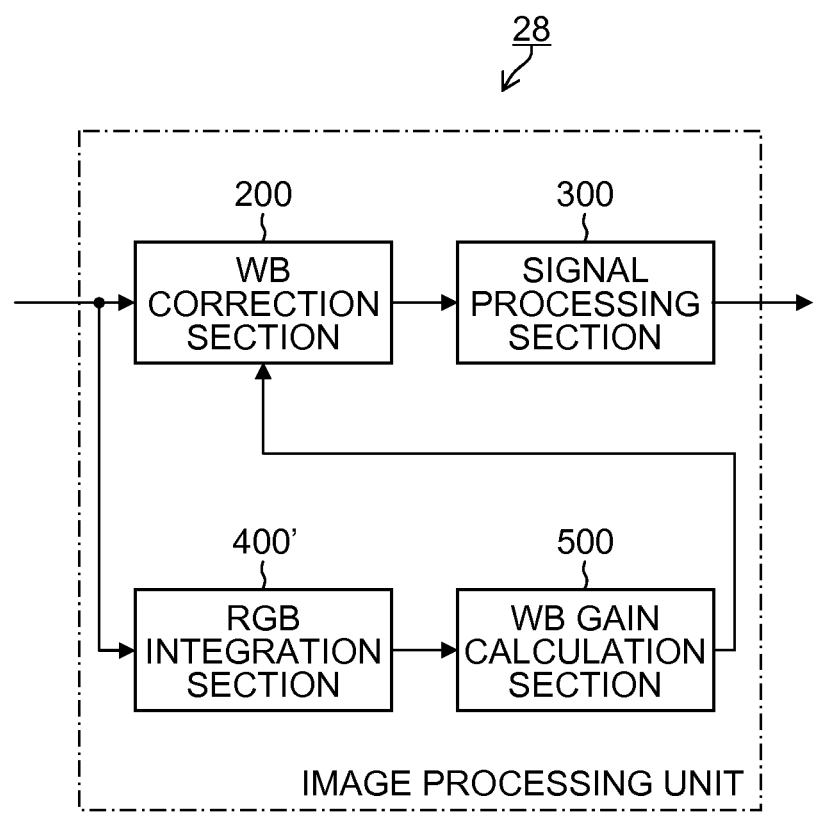
FIG. 11 is a main section block diagram illustrating an inside configuration of a second embodiment of the image processing unit illustrated in FIG. 1.

FIG. 11 is a main section block diagram illustrating an inside configuration of a second embodiment of the image processing unit 28 illustrated in FIG. 1.

As illustrated in FIG. 11, the image processing unit 28 includes the white balance (WB) correction section 200, the signal processing section 300, the RGB integration section 400', and the WB gain calculation section 500. As compared with the image processing unit 28 of the first embodiment illustrated in FIG. 4, the image processing unit 28 of the second embodiment illustrated in FIG. 11 is different in that the mixed color correction section 100 is not included, and different in a configuration of the RGB integration section 400'.

Thus, only the RGB integration section 400' will be described in detail below, but descriptions of configurations of other sections are omitted.

The RGB integration section 400' is common to the RGB integration section 400 illustrated in FIG. 4 in that each of color signals of RGB is integrated for each of divisions (refer to FIG. 8) of 8×8 into which one screen is divided so that an integration average value of the color signals is calculated, but is different in that processing of eliminating influence of mixed colors or the like is performed in a calculation process of the integration average value.

Figure 12:
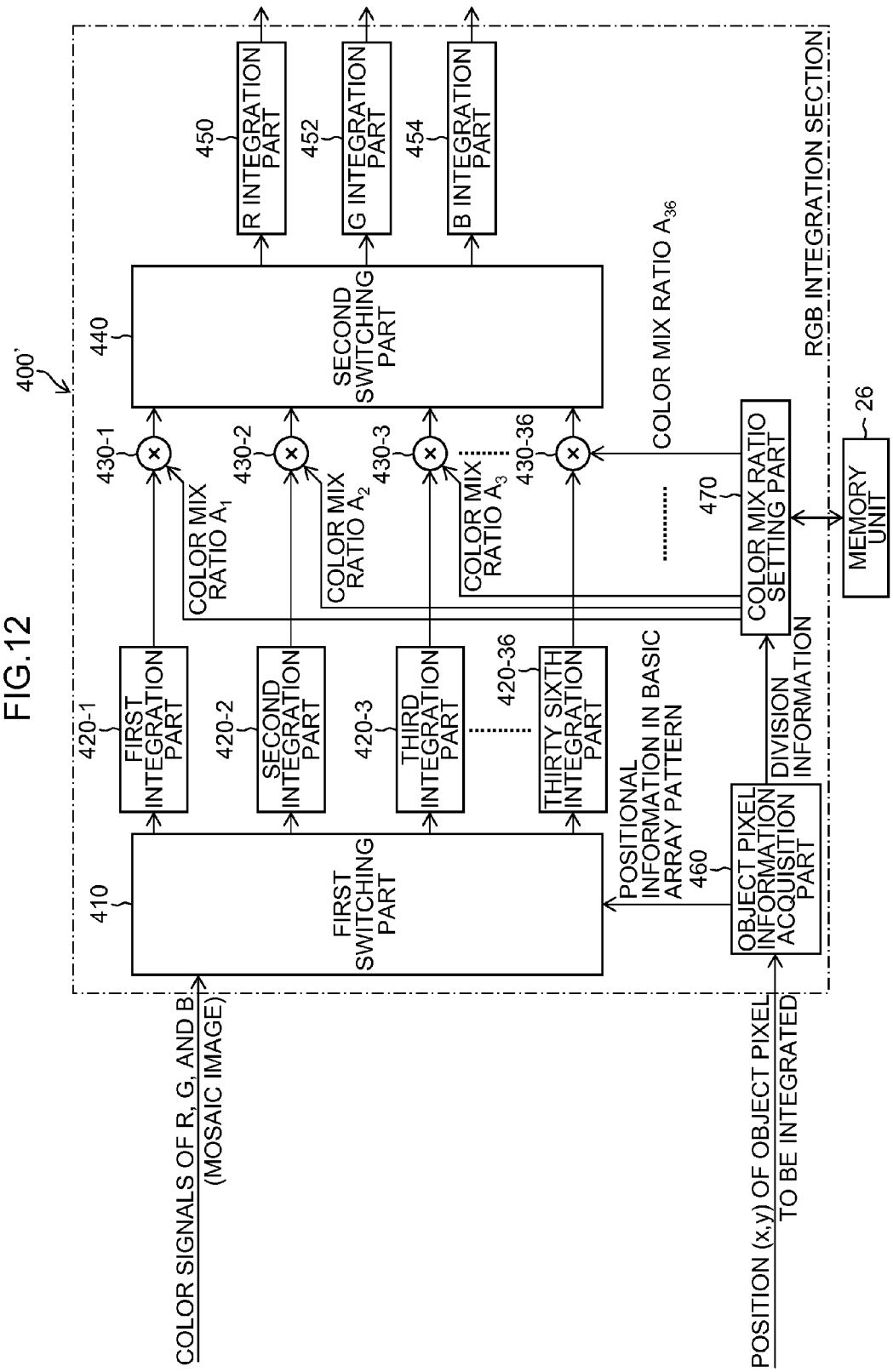
FIG. 12 is a block diagram illustrating an embodiment of an inside configuration of an RGB integration section illustrated in FIG. 11.

FIG. 12 is a block diagram illustrating an embodiment of an inside configuration of the RGB integration section 400' illustrated in FIG. 11.

The RGB integration section 400' includes a first switching part 410, a first calculation unit (first to thirty sixth integration parts 420-1 to 420-36), an integrated value correction unit (multipliers 430-1 to 430-36), a second switching part 440, a second calculation unit (an R integration part 450, a G integration part 452, and a B integration part 454), an object pixel information acquisition part 460, and a color mix ratio setting part 470.

In FIG. 12, a mosaic image (color signals of RGB) acquired through the imaging element 22 is supplied to the first switching part 410 in a point sequence (image acquisition step). In this embodiment, a mosaic image is supplied for each of 64 divisions illustrated in FIG. 8 in a point sequence.

Meanwhile, information illustrating a position (x,y) of an object pixel for mixed color correction in the mosaic image, the object pixel being supplied to the first switching part 410, is supplied to the object pixel information acquisition part 460. The object pixel information acquisition part 460 acquires positional information illustrating a position of the object pixel in the basic array pattern (a position of any one of the positions (1) to (36) illustrated in FIG. 5) and division information illustrating divisions to which the object pixel belongs (refer to FIG. 8) based on the information illustrating the position (x,y) of the object pixel. The positional information on the object pixel in the basic array pattern and the division information, being acquired by the object pixel information acquisition part 460, are outputted to the first switching part 410 and the color mix ratio setting part 470, respectively.

The first switching part 410 outputs a color signal of an integration object supplied in a point sequence to any one of the first to thirty sixth integration parts 420-1 to 420-36 by being switched (sorted) based on positional information in the basic array pattern received from the object pixel information acquisition part 460. In a case where a color signal of an integration object corresponds to the position (1) in the basic array pattern illustrated in FIG. 5, for example, the color signal is outputted to the first integration part 420-1 as well as is outputted to the thirty sixth integration parts 420-36 in a case where the color signal of the integration object corresponds to the position (36).

Each of the first to thirty sixth integration parts 420-1 to 420-36 integrates each of color signals received as described above, and when integration of color signals in one division is finished, outputs each of integrated values to each of the multipliers 430-1 to 430-36 (first calculation step). After then, the first to thirty sixth integration parts 420-1 to 420-36 reset integrated values at zero to integrate color signals of a subsequent division.

The color mix ratio setting part 470 receives division information illustrating a division in which the first to thirty sixth integration parts 420-1 to 420-36 are currently integrating color signals from the object pixel information acquisition part 460, and then selects a correction table (refer to FIG. 7) corresponding to the division from the memory unit 26 based on the division information to input each of the color mix ratios $A_1$ to $A_{36}$ registered in the selected correction table to each of multipliers 430-1 to 430-36 together with another input.

Each of the multipliers 430-1 to 430-36 multiplies the received integrated value and color mix ratio A together to output the multiplication result to the second switching part 440 as an integrated value in which influence of a mixed color or the like is eliminated (integrated value correction step).

The second switching part 440 sorts received 36 multiplication values for each of colors of RGB to output multiplication values of R to the R integration part 450 as well as multiplication values of G to the G integration part 452, and multiplication values of B to the B integration part 454.

Each of the R integration part 450, G integration part 452, and B integration part 454 integrate the multiplication values received from the second switching part 440 to obtain an average value by dividing the integration values by the number of all pixels (second calculation step). The integration average value for each RGB obtained as above is outputted to the WB gain calculation section 500 (FIG. 11) of a subsequent stage.

As described above, the RGB integration section 400 calculates integration average values of RGB, in which influence of a mixed color or the like is eliminated for each of divisions by using a correction table corresponding to each of the divisions. Accordingly, the WB gain calculation section 500 is able to calculate a proper WB gain in which influence of a mixed color or the like is eliminated.

[Others]

The present invention is not limited to the mosaic image composed of the color filter array illustrated in FIG. 2, but is applicable to mosaic images of a variety of color filter arrays. The present invention is also applicable to a mosaic image composed of only the A-array or the B-array illustrated in FIG. 3, for example. A size N×M of the basic array pattern to which the present invention is applied is preferably 5×5 or more, and is more preferably 10×10 or less.

If a pixel size of a basic array pattern is increased by the square to allow degrees of freedom of an array of pixels of three colors of RGB to increase, the number of combinations of color arrangement of adjacent peripheral pixels is increased to increase the number of different color mix ratios, therefore, the present invention is effective. In a size of 5×5, there are 25 pixels, so that advantageous effects of the present Invention will be sufficiently achieved. Meanwhile, considering ease of image processing such as synchronization processing, and thinning processing at the time of capturing moving images, it is desirable that, each of "N" and "M" is 10 or less.

In addition, the present invention is also applicable to a mosaic image acquired from an imaging element in which no amplifier shared by pixels is embedded. Further, if there is little influence of a mixed color or the like in a central portion and a peripheral portion of a mosaic image, it is unnecessary to have a correction table of color mix ratios for each of divisions.

<Additional Embodiments of Color Filter Arrays>

In each of the embodiments described above, an example of green (G) serving as a first color, and red (R) and blue (B) serving as second colors is described, however, colors applicable to a color filter are not limited to the colors above. In addition, in each of the embodiments described above, color filters corresponding to colors satisfying conditions below are applicable.

<Condition of a First Filter (First Color)>

In each of the embodiments described above, a filter satisfying any one of conditions (1) to (4) described below is applicable instead of the G filters or by being replaced with a part of the G filters, for example.

[Condition (1)]

The condition (1) is defined that a contribution rate to obtain a luminance signal is 50% or more. The contribution rate of 50% is a value determined to discriminate the first color (G color, and the like) and the second color (R and B colors, and the like) in accordance with each of the embodiments described above so that a color with a contribution rate to obtain luminance data, the contribution rate being relatively higher than that of the R color, the B color, or the like, is included in the "first color".

For example, the G color has a contribution rate to obtain a luminance (Y) signal (luminance data), which is higher than that of the R color and the B color, that is, the contribution rates of the R color and the B color are lower than that of the G color. Specifically, the image processing unit 28 described above generates a luminance signal (Y signal) from an RGB pixel signal having color information on all RGB for each of pixels, according to an expression (1) below. The expression (1) below is general used to generate the Y signal in the color imaging element 22. In the expression (1), a contribution rate of the G color to a luminance signal becomes 60%, so that the G color has a contribution rate higher than contribution rates of the R color (contribution rate of 30%) and the B color (contribution rate of 10%). Thus, the G color most contributes to a luminance signal in the three primary colors.

$Y = 0.3R + 0.6G + 0.1B$  Expression (1)

The contribution rate of the G color is 60% as illustrated in the expression (1) above, so that the G color satisfies the condition (1). It is also possible to obtain contribution rates of colors other than the G color by experiment or simulation. Accordingly, a filter having a color other than the G color, the color having a contribution rate of 50% or more, is applicable as a first filter in each of the embodiments above. In addition, a color having a contribution rate of less than 50% serves as the second color (the R color, the B color, and the like) in each of the embodiments above, so that a filter having the color serves as a second filter in each of the embodiments above.

[Condition (2)]

The condition (2) is defined that a peak of transmittance of a filter has a wavelength within a range of 480 m or more and 570 nm or less. The transmittance of a filter is a value measured by a spectrophotometer, for example. The wavelength range is determined to discriminate the first color (G color and the like) and the second color (R and B colors and the like) in accordance with each of the embodiments above so that peaks of wavelengths of the R color, the B color, and the like, with a relatively lower contribution rate described before, are not included, but peaks of wavelengths of the G color and the like, with a relatively higher contribution rate, are included. Accordingly, a filter with a peak of transmittance has a wavelength within a range of 480 nm or more and 570 nm or less is applicable as the first filter. In addition, a filter with a peak of transmittance out of the range of a wavelength of 480 nm or more and 570 nm or less serves as the second filter (the R-filter and the B-filter) in accordance with each of the embodiments above.

[Condition (3)]

The condition (3) is defined that transmittance with a wavelength within a range of 500 nm or more and 560 nm or less is higher than transmittance of the second filter (the R-filter and the B-filter). Even in the condition (3), the transmittance of a filter is a value measured by a spectrophotometer, for example. The wavelength range of the condition (3) is also determined to discriminate the first color (G color and the like) and the second color (R and B colors and the like) in accordance with each of the embodiments above so that transmittance of a filter having a color with a contribution rate described before relatively higher than contribution rates of the R color, the B color, and the like, is higher than transmittance of the R-filter, the B-filter, and the like. Accordingly, a filter with transmittance relatively higher within the range of a wavelength of 500 nm or more and 560 nm or less is applicable as the first filter, and a filter with transmittance relatively lower is applicable as the second filter.

[Condition (4)]

The condition (4) is defined that a filter of two or more colors including a color (the G color in RGB, for example) most contributing to a luminance signal in the three primary colors, and a color different from the three primary colors, is used as the first filter. In this case, a filter corresponding to a color other than each of the colors of the first filter serves as the second filter.

<A Plurality of Types of the First Filter (G-Filter)>

Thus, the G-filter of the G color as the first filter is not limited to one type, but a plurality of types of the G-filter is applicable as the first filter, for example, that is, the G-filter of the color filter (basic array pattern) in accordance with each of the embodiments described above may be appropriately replaced with the first G-filter G1 or the second G-filter G2. The first G-filter G1 transmits G-light with a first wavelength band, and the second G-filter G2 transmits G-light with a second wavelength band having a high correlation with the first G-filter G1 (refer to FIG. 13).

The existing G-filter (the G-filter G of the first embodiment, for example) is applicable as the first G-filter G1. A filter having a high correlation with the first G-filter G1 is applicable as the second G-filter G2. In this case, it is desirable that a peak value of a spectral sensitivity curve of a light receiving element in which the second G-filter G2 is arranged has a wavelength within a range of 500 nm to 535 nm, for example (close to a peak value of a spectral sensitivity curve of a light receiving element in which the existing G-filter is arranged). In addition, the method described in Japanese Patent Application Laid-Open No. 2003-284084 is used as a method of determining color filters of four colors (R, G1, G2, and B), for example.

As described above, allowing a color imaging element to acquire an image by four colors to increase color information to be acquired enables the image to be expressed with more accurate color as compared with a case in which only three types of colors (RGB) are acquired, that is, it is possible to reproduce colors so that a different color viewed with eyes is expressed as a different color, and the same color viewed with eyes is expressed as the same color (to improve "color discrimination").

Since transmittance of the first and second G-filters G1 and G2 is basically the same as transmittance of the G-filter G of the first embodiment, a contribution rate to obtain a luminance signal is higher than 50%. Thus, the first and second G-filters G1 and G2 satisfy the condition (1) described before.

Figure 13:
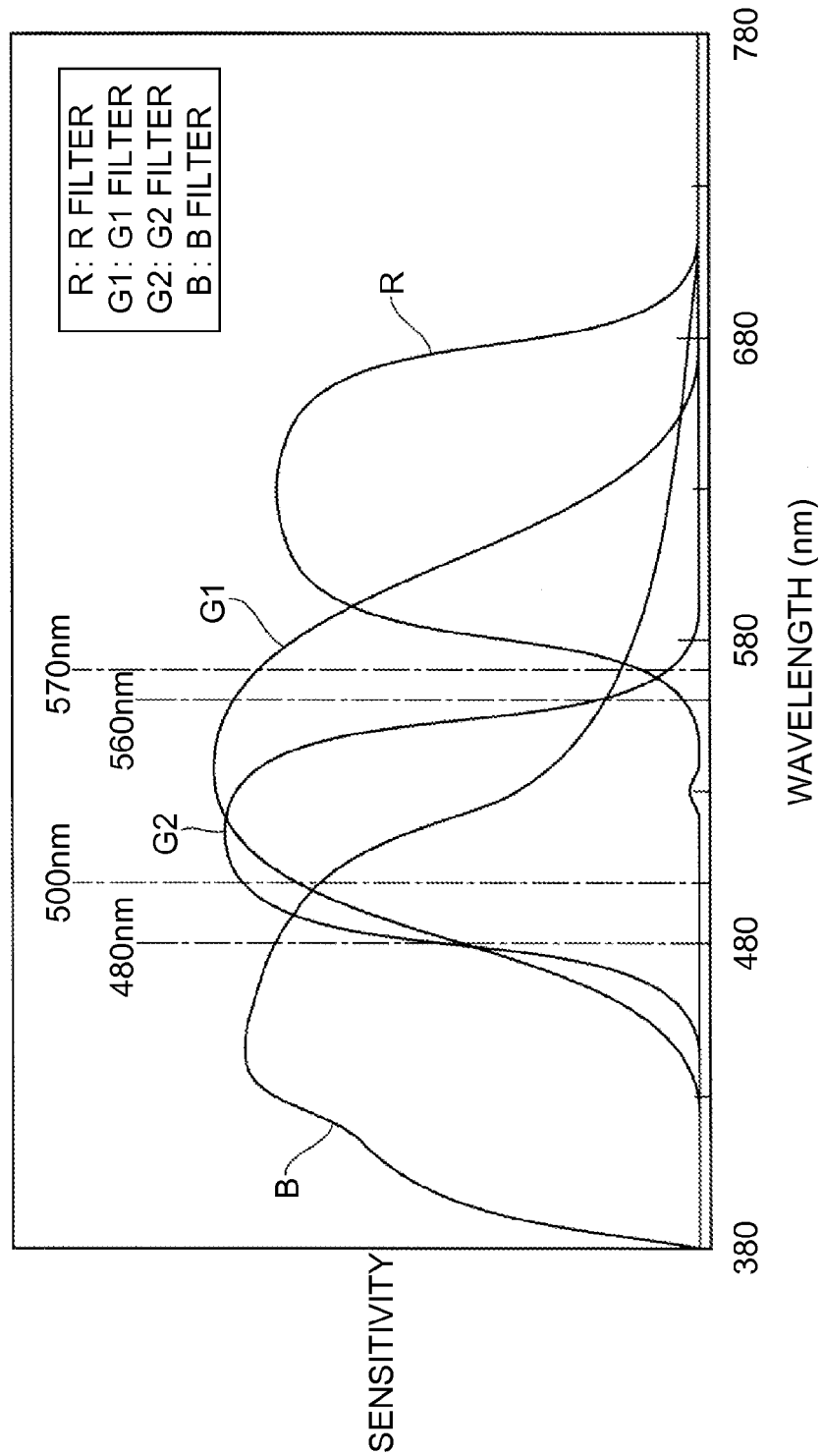
FIG. 13 is a graph illustrating spectral sensitivity characteristics of an imaging element including an R-filter (red filter), a G1-filter (first green filter), a G2-filter (second green filter), and a B-filter (blue filter).

In FIG. 13 illustrating spectral sensitivity characteristics of a color filter array (light receiving element), a peak transmittance of each of the G-filters G1 and G2 (a peak of sensitivity of each of the G-pixels) has a wavelength within a range of 480 nm or more and 570 nm or less. Transmittance of each of the G-filters G1 and G2 with a wavelength within a range of 500 nm or more and 560 nm or less becomes higher than transmittance of RB filters R and B. Thus, each of the G-filters G1 and G2 also satisfy the conditions (2) and (3) described before.

Arrangement and the number of each of the G-filters G1 and G2 may be appropriately changed. In addition, the number of types of the G-filter G may be increased to three or more.

<Transparent Filter (W-Filter)>

In the embodiment described above, although a color filter composed of color filters corresponding to RGB colors is mainly illustrated, a transparent filter W (a white color pixel) may serves as a part of the color filters. In particular, it is preferable to arrange the transparent filter W by being replaced with a part of the first filter (G-filter G). Replacing a part of the G-pixel with the white color pixel as above enables color reproducibility to be prevented from being deteriorated even if a pixel size is fined.

The transparent filter W has a transparent color (first color). The transparent filter W allows light corresponding to a wavelength region of visible light to be transmitted therethrough, and has transmittance of light of each of RGB colors, the transmittance being 50% or more, for example. Transmittance of the transparent filter W is to be higher than that of the G-filter G, so that a contribution rate to obtain a luminance signal becomes higher than that of the G color (60%), thereby satisfying the condition (1) described before.

Figure 14:
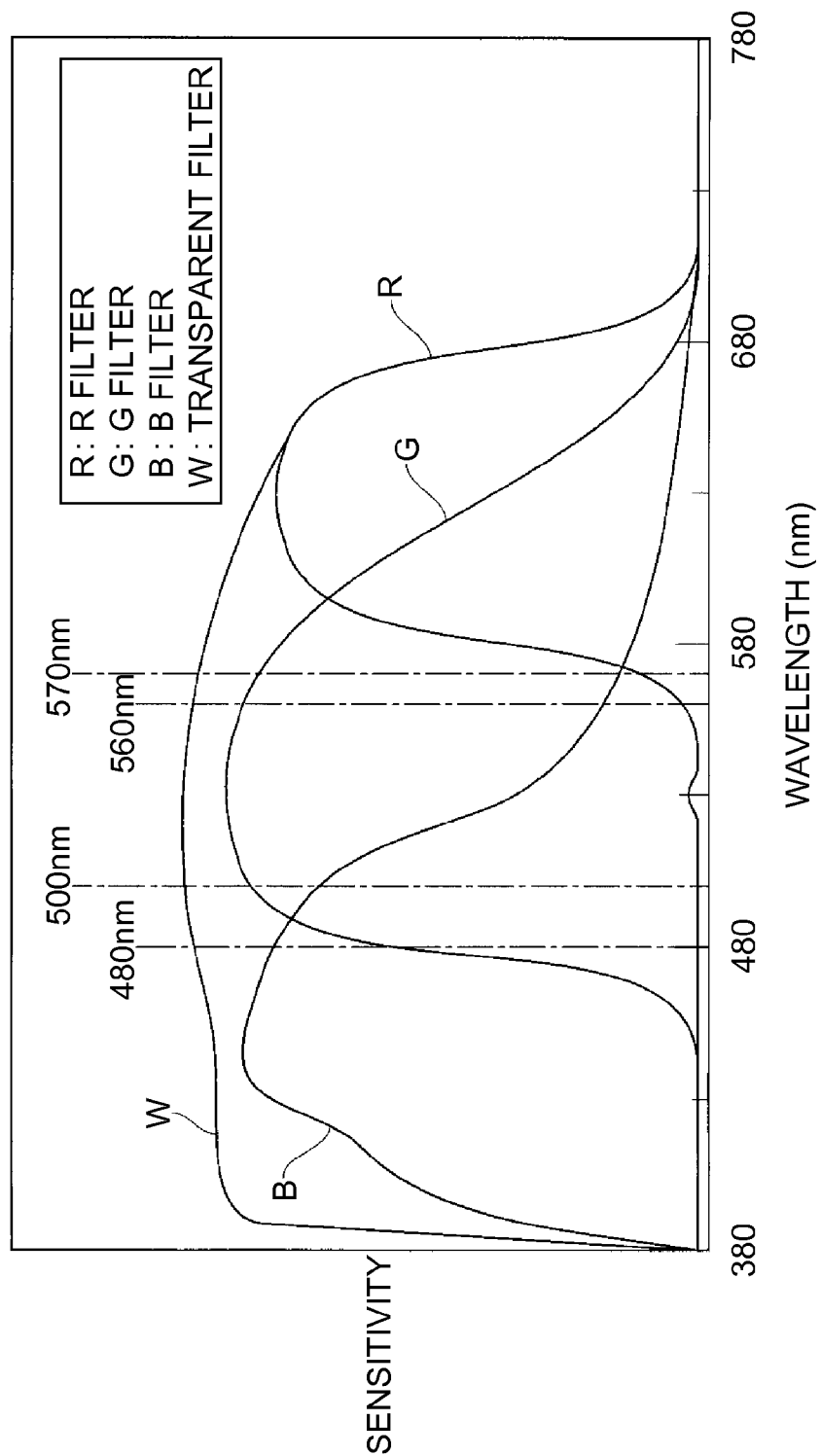
FIG. 14 is a graph illustrating spectral sensitivity characteristics of an imaging element including an R-filter, a G-filter, a B-filter and a W-filter (transparent filter).

In FIG. 14 illustrating spectral sensitivity characteristics of a color filter array (light receiving element), a peak transmittance of the transparent filter W (a peak of sensitivity of the white color pixel) has a wavelength within a range of 480 nm or more and 570 nm or less. In addition, transmittance of the transparent filter W with a wavelength within a range of 500 nm or more and 560 nm or less becomes higher than transmittance of RB filters R and B, whereby the transparent filter W satisfies conditions (2) and (3) described before. The G-filter G satisfies the conditions (1) to (3) described before as well as the transparent filter W.

As described above, since the transparent filter W satisfies the conditions (1) to (3) described before, the transparent filter W is applicable as the first filter in each of the embodiments above. In the color filter array, a part of the G-filter G corresponding to the G color most contributing a luminance signal in three primary colors of RGB is replaced with the transparent filter W, thereby also satisfying the condition (4) described before.

<Emerald Filter (E-Filter)>

In the embodiment described above, although a color filter composed of color filters corresponding to RGB colors is mainly illustrated, a part of the color filters may be replaced with another color filter, for example, an E-filter (emerald pixel) corresponding to emerald (E) color may be applicable. In particular, it is preferable to arrange an emerald filter (E-filter) by being replaced with a part of the first filter (G-filter G). It is possible to improve reproduction of high region components of luminance to reduce jaggedness and improve resolution feeling by using a color filter array of four colors, in which a part of the G-filter G is replaced with the E-filter as described above.

Figure 15:
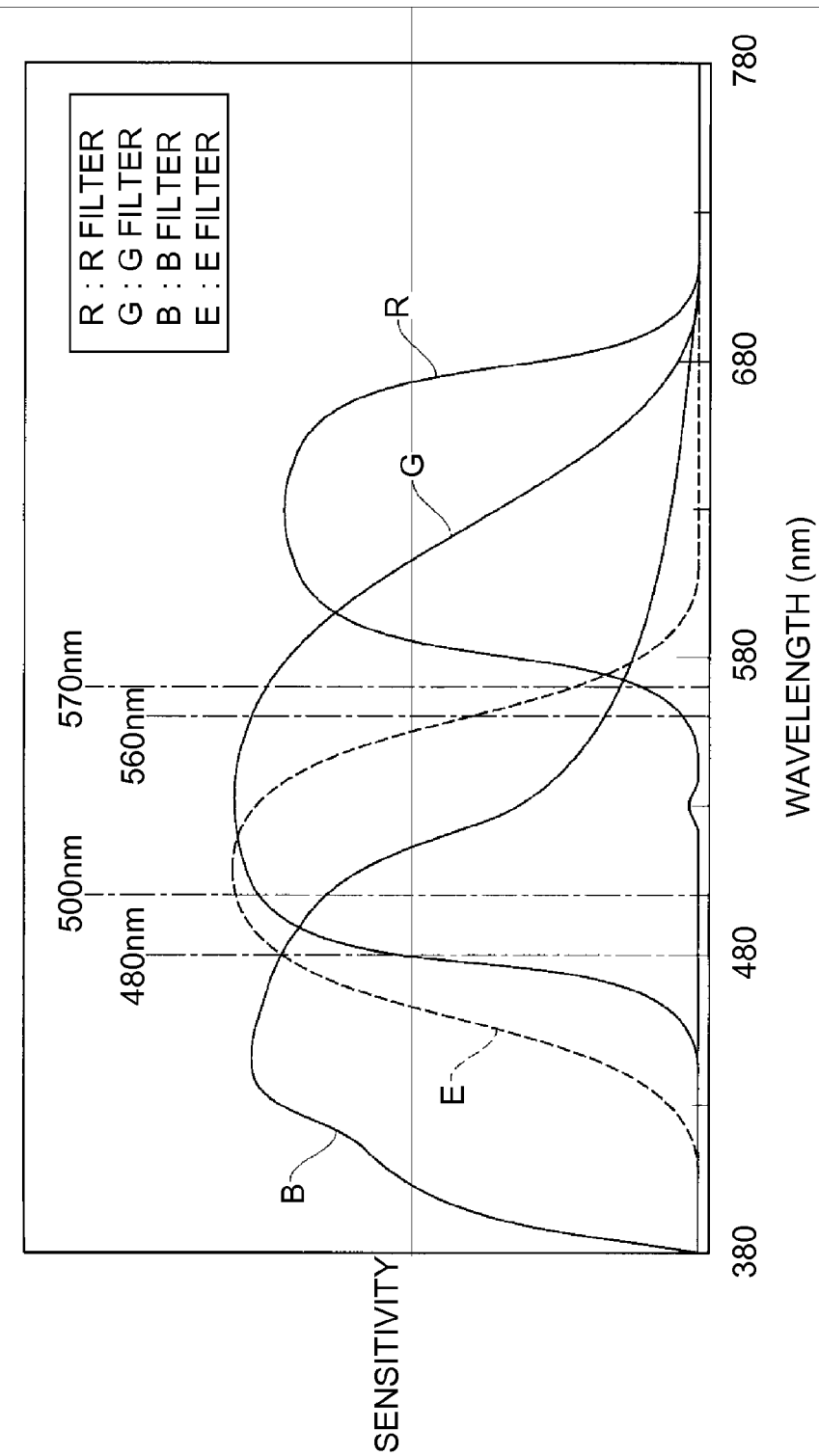
FIG. 15 is a graph illustrating spectral sensitivity characteristics of an imaging element including an R-filter, a G-filter, a B-filter and an E-filter (emerald filter).

In FIG. 15 illustrating spectral sensitivity characteristics of a color filter array (light receiving element), a peak transmittance of the emerald filter E (a peak of sensitivity of the E pixel) has a wavelength within a range of 480 nm or more and 570 nm or less. In addition, transmittance of the emerald filter E with a wavelength within a range of 500 nm or more and 560 nm or less becomes higher than transmittance of RB filters R and B, whereby the emerald filter E satisfies conditions (2) and (3) described before. In the color filter array, a part of the G-filter G corresponding to the G color most contributing a luminance signal in three primary colors of RGB is replaced with the emerald filter E, thereby also satisfying the condition (4) described before.

In the spectral characteristics illustrated in FIG. 15, the emerald filter E has a peak at a wavelength shorter than a wavelength of a peak of the G-filter G, but sometimes has a peak wavelength longer than a wavelength of a peak of the G-filter G (viewed as a color a little close to yellow color). As described above, it is possible to select an emerald filter E that satisfies each of conditions described above, so that it is also possible to select an emerald filter E that satisfies the condition (1), for example.

<Types of Other Colors>

In each of the embodiments described above, a color filter array composed of color filters of the primary colors RGB is described however, the present invention is applicable to a color filter array composed of color filters of four colors composed of complementary colors of the primary colors RGB including C (cyan), M (magenta), and Y (yellow), and added G, for example. In this case, a color filter satisfying any one of the conditions (1) to (4) described above serves as the first filter in accordance with each of the embodiments above, and other color filters serve as the second filter.

<Honeycomb Arrangement>

Each of color filter arrays of each of the embodiments above includes a basic array pattern in which color filters of each color are arrayed in a horizontal direction (H) and a vertical direction (V) to form a two-dimensional array, the basic array pattern being repeatedly arrayed in the horizontal direction (H) and the vertical direction (V), however, the present invention is not limited to the color filter arrays above.

For example, the color filter may be composed of an array pattern formed by using a basic array pattern of so-called a honeycomb array formed by turning the basic array pattern of each of the embodiments above around an optical axis by 45°, the basic array pattern being repeatedly arrayed in the oblique direction (NE or NW).

The present invention is not limited to the embodiments described above, therefore, it is needless to say that a variety of modifications are possible within a range without departing from the spirit of the present invention.

What is claimed is:

1. An image processing device comprising:
an image acquisition unit configured to acquire a mosaic image taken by an imaging unit including an imaging element having a pixel structure of I×J ("I" and "J" are integers of 2 or more, at least one of the integers is 3 or more) pixels in a repeated cycle;
a storage unit configured to store each of color mix ratios corresponding to each of pixels in the I×J pixels by being associated with a pixel position in the I×J pixels;
a mixed color correction unit configured to eliminate mixed color components mixed from peripheral pixels included in a color signal of each of pixels in the mosaic image acquired by the image acquisition unit, the mixed color correction unit reading out a color mix ratio associated with the pixel position in the I×J pixels of any object pixel for mixed color correction from the storage unit and eliminating the mixed color components included in the object pixel based on the read-out color mix ratio and a color signal of the object pixel;
a calculation unit configured to calculate an average value for each color based on a color signal of each of pixels in the mosaic image, in which a mixed color is corrected by the mixed color correction unit;
a white balance gain calculation unit configured to calculate a white balance gain based on the average value for each color calculated by the calculation unit; and
a white balance correction unit configured to apply white balance correction to the color signal of each of pixels in the mosaic image based on the white balance gain calculated by the white balance gain calculation unit.

2. An image processing device comprising:
an image acquisition unit configured to acquire a mosaic image taken by imaging unit including an imaging element having a pixel structure of I×J ("I" and "J" are integers of 2 or more, at least one of the integers is 3 or more) pixels in a repeated cycle;
a storage unit configured to store each of color mix ratios corresponding to each of pixels in the I×J pixels by being associated with a pixel position in the I×J pixels;
a first calculation unit configured to calculate an integrated value for each pixel position in the I×J pixels of a color signal of each of pixels in the mosaic image acquired by the image acquisition unit;
an integrated value correction unit configured to correct the integrated value for each pixel position in the I×J pixels calculated by the first calculation unit based on the integrated value and a color mix ratio associated with the pixel position in the I×J pixels;
a second calculation unit configured to calculate an average value for each color by adding the integrated value for each pixel position in the I×J pixels for each color, corrected by the integrated value correction unit;
a white balance gain calculation unit configured to calculate a white balance gain based on the average value for each color calculated by the second calculation unit; and
a white balance correction unit configured to apply white balance correction to the color signal of each of pixels in the mosaic image based on the white balance gain calculated by the white balance gain calculation unit.

3. The image processing device according to claim 1, wherein the mosaic image includes a pixel group of a basic array pattern composed of M×N (M ≤I, N ≤J) pixels having color pixels of a plurality of colors and serves as an image in which the pixel group of the basic array pattern is repeatedly arranged in a horizontal direction and a vertical direction.

4. The image processing device according to claim 1, wherein the mosaic image is outputted from an imaging element having an element structure in which an amplifier is shared for each predetermined pixel group, and the predetermined pixel group has a size of K×L (K ≤M, L ≤N, K and L are natural numbers) pixels.

5. The image processing device according to claim 1, wherein the storage unit stores a color mix ratio for each division when a whole region of the mosaic image is divided into a plurality of divisions.

6. An image processing method comprising:
an image acquisition step of acquiring a mosaic image taken by an imaging unit including an imaging element having a pixel structure of I×J ("I" and "J" are integers of 2 or more, at least one of the integers is 3 or more) pixels in a repeated cycle;
a step of preparing a storage unit configured to store each of color mix ratios corresponding to each of pixels in the I×J pixels by being associated with a pixel position in the I×J pixels;
a mixed color correction step of eliminating mixed color components mixed from peripheral pixels included in a color signal of each of pixels in the mosaic image acquired by the image acquisition step, a mixed color correction step of reading out a color mix ratio associated with a pixel position in the I×J pixels of any object pixel for mixed color correction from the storage unit and eliminating the mixed color components included in the object pixel based on the read-out color mix ratio and a color signal of the object pixel;
a calculation step of calculating an average value for each color based on a color signal of each of pixels in the mosaic image, in which a mixed color is corrected in the mixed color correction step;
a white balance gain calculation step of calculating a white balance gain based on the average value for each color calculated in the calculation step; and
a white balance gain correction step of applying white balance correction to the color signal of each of pixels in the mosaic image based on the white balance gain calculated in the white balance gain calculation step.

7. An image processing method comprising:
an image acquisition step of acquiring a mosaic image taken by an imaging unit including an imaging element having a pixel structure of I×J ("I" and "J" are integers of 2 or more, at least one of the integers is 3 or more) pixels in a repeated cycle;
a step of preparing a storage unit configured to store each of color mix ratios corresponding to each of pixels in the I×J pixels by being associated with a pixel position in the I×J pixels;
a first calculation step of calculating an integrated value for each pixel position in the I×J pixels of a color signal of each of pixels in the mosaic image acquired in the image acquisition step;
an integrated value correction step of correcting the integrated value for each pixel position in the I×J pixels calculated in the first calculation step based on the integrated value and a color mix ratio associated with a pixel position in the I×J pixels;
a second calculation step of calculating an average value for each color corrected in the integrated value correction step by adding the integrated value for each pixel position in the I×J pixels for each color;

a white balance gain calculation step of calculating a white balance gain based on the average value for each color calculated in the second calculation step; and a white balance gain correction step of applying white balance correction to the color signal of each of pixels in the mosaic image based on the white balance gain calculated in the white balance gain calculation step.

8. An imaging device comprising:

an imaging unit having a photographic optical system, and an imaging element on which a subject image is formed through the photographic optical system;

the image acquisition unit configured to acquire a mosaic image outputted from the imaging unit; and the image processing device according to claim 1.

9. The imaging device according to claim 8, wherein the imaging element has a structure in which a color filter with a predetermined color filter array is arranged on a plurality of pixels composed of photoelectric conversion elements arranged in a horizontal direction and a vertical direction, the color filter array includes a predetermined basic array pattern in which there are arranged a first filter corresponding to a first color consisting of one or more colors, and a second filter corresponding to a second color consisting of two or more colors, the second color having a contribution rate for acquiring a luminance signal, the contribution rate being lower than that of the first color, and in which the basic array pattern is repeatedly arranged in the horizontal direction and the vertical direction, and the basic array pattern serves as an array pattern corresponding to M×N (M ≤I, N ≤J) pixels.

10. The imaging device according to claim 9, wherein one or more of the first filters are arranged in each of lines in the horizontal direction, the vertical direction, an oblique upper right direction, and an oblique lower right direction in the color filter array, one or more of the second filters corresponding to each of colors of the second color are arranged in each of lines in the horizontal direction and the vertical direction in the color filter array in the basic array pattern, and a ratio of a pixel number of the first color corresponding to the first filter is larger than a ratio of a pixel number of each color of the second color corresponding to the second filter.

11. The imaging device according to claim 9, wherein the basic array pattern is a square array pattern corresponding to 3×3 pixels, and the first filter is arranged at a center and four corners thereof.

12. The imaging device according to claim 9, wherein the first color is green (G), and the second colors are red (R) and blue (B), the predetermined basic array pattern is a square array pattern corresponding to 6×6 pixels, and wherein the color filter array includes: a first array corresponding to 3×3 pixels, the first array including the G-filters arranged at a center and four corners thereof, B-filters arranged up and down across the G-filter arranged at the center, and R-filters arranged right and left across the G-filter arranged at the center; and a second array corresponding to 3×3 pixels, the second array including G-filters arranged at a center and four corners thereof, R-filters arranged up and down across the G-filter arranged at the center, and B-filters arranged right and left across the G-filter arranged at the center;

the first array and the second array being alternately arranged in the horizontal direction and the vertical direction.

13. The imaging device according to claim 8, wherein the imaging element has an element structure in which an amplifier is shared for each predetermined pixel group, and the predetermined pixel group has a size of K×L (K ≤M, L ≤N, K and L are natural numbers) pixels.

14. The imaging device according to claim 13, wherein a pixel structure of the imaging element of the I×J pixels in a repeated cycle is used in a cycle of a least common multiple of a basic array pattern of the M×N pixels and a predetermined pixel group of the K×L pixels.

15. The image processing device according to claim 1, wherein the mixed color correction unit eliminates the mixed color components included in the object pixel by multiplying a read color mix ratio by the color signal of the object pixel.

16. The image processing device according to claim 2, wherein the integrated value correction unit corrects the integrated value for each pixel position in the I×J pixels by multiplying the integrated value by the color mix ratio associated with the pixel position in the I×J pixels.

17. An imaging device comprising:

an imaging unit having a photographic optical system, and an imaging element on which a subject image is formed through the photographic optical system;

the image acquisition unit configured to acquire a mosaic image outputted from the imaging unit; and the image processing device according to claim 2.

18. The imaging device according to claim 17, wherein the imaging element has a structure in which a color filter with a predetermined color filter array is arranged on a plurality of pixels composed of a photoelectric conversion elements arranged in a horizontal direction and a vertical direction, the color filter array includes a predetermined basic array pattern in which there are arranged a first filter corresponding to a first color consisting of one or more colors, and a second filter corresponding to a second color consisting of two or more colors, the second color having a contribution rate for acquiring a luminance signal, the contribution rate being lower than that of the first color, and in which the basic array pattern is repeatedly arranged in the horizontal direction and the vertical direction, and the basic array pattern serves as an array pattern corresponding to M×N (M≤I, N≤J) pixels.

19. The imaging device according to claim 18, wherein one or more of the first filters are arranged in each of lines in the horizontal direction, the vertical direction, an oblique upper right direction, and an oblique lower right direction in the color filter array, one or more of the second filters corresponding to each of colors of the second color are arranged in each of lines in the horizontal direction and the vertical direction in the color filter array in the basic array pattern, and a ratio of a pixel number of the first color corresponding to the first filter is larger than a ratio of a pixel number of each color of the second color corresponding to the second filter.

20. The imaging device according to claim 18, wherein the basic array pattern is a square array pattern corresponding to 3×3 pixels, and the first filter is arranged at a center and four corners thereof.

21. The imaging device according to claim 18,
wherein the first color is green (G), and the second colors are red (R) and blue (B),
the predetermined basic array pattern is a square array pattern corresponding to 6×6 pixels, and
wherein the color filter array includes: a first array corresponding to 3×3 pixels, the first array including the G-filters arranged at a center and four corners thereof, B-filters arranged up and down across the G-filter arranged at the center, and R-filters arranged right and left across the G-filter arranged at the center; and a second array corresponding to 3×3 pixels, the second array including G-filters arranged at a center and four corners thereof, R-filters arranged up and down across the G-filter arranged at the center, and B-filters arranged right and left across the G-filter arranged at the center; the first array and the second array being alternately arranged in the horizontal direction and the vertical direction.

22. The imaging device according to claim 17,
wherein the imaging element has an element structure in which an amplifier is shared for each predetermined pixel group, and
the predetermined pixel group has a size of K×L (K≤M, L≤N, K and L are natural numbers) pixels.

23. The imaging device according to claim 22,
wherein a pixel structure of the imaging element of the I×J pixels in a repeated cycle is used in a cycle of a least common multiple of a basic array pattern of the M×N pixels and a predetermined pixel group of the K×L pixels.

* * * * *